United States Patent
Kageyama et al.

(10) Patent No.: US 11,079,294 B2
(45) Date of Patent: Aug. 3, 2021

(54) OPERATION LEVER

(71) Applicant: Komatsu Ltd., Tokyo (JP)

(72) Inventors: Masato Kageyama, Tokyo (JP); Hiroki Shinozaki, Tokyo (JP); Daigoh Fujii, Tokyo (JP)

(73) Assignee: Komatsu Ltd., Tokyo (JP)

( * ) Notice: Subject to any disclaimer, the term of this patent is extended or adjusted under 35 U.S.C. 154(b) by 56 days.

(21) Appl. No.: 16/329,347

(22) PCT Filed: Feb. 16, 2018

(86) PCT No.: PCT/JP2018/005518
§ 371 (c)(1),
(2) Date: Feb. 28, 2019

(87) PCT Pub. No.: WO2018/159330
PCT Pub. Date: Sep. 7, 2018

(65) Prior Publication Data
US 2019/0250054 A1    Aug. 15, 2019

(30) Foreign Application Priority Data

Feb. 28, 2017    (JP) .............................. JP2017-037130

(51) Int. Cl.
*G01L 5/22* (2006.01)
*E02F 9/20* (2006.01)
(Continued)

(52) U.S. Cl.
CPC ................ *G01L 5/223* (2013.01); *E02F 9/20* (2013.01); *E02F 9/2004* (2013.01); *F16H 59/02* (2013.01);
(Continued)

(58) Field of Classification Search
CPC ......... G05G 9/047; G05G 2009/04755; G05G 9/04737; G05G 2009/04703–04733;
(Continued)

(56) References Cited

U.S. PATENT DOCUMENTS 4,825,157 A * 4/1989 Mikan ..................... G01B 7/004
200/6 A
4,866,854 A * 9/1989 Seltzer .................. B23P 19/105
33/558
(Continued)

FOREIGN PATENT DOCUMENTS

CN     1373891 A    10/2002
CN   201667039 U   12/2010
(Continued)

OTHER PUBLICATIONS

International Search Report dated Apr. 24, 2018, issued for PCT/JP2018/005518.

*Primary Examiner* — Tran M. Tran
(74) *Attorney, Agent, or Firm* — Locke Lord LLP

(57) ABSTRACT

An operation lever includes: a pair of rods disposed at point-symmetrical positions with respect to an operation axis; magnets disposed on the respective rods; and a pair of magnetic sensors disposed at line-symmetrical positions with respect to a second straight line perpendicular to a first straight line connecting centers of one of the rods and the other rod, on a plane perpendicular to the operation axis.

9 Claims, 14 Drawing Sheets

(51) Int. Cl.
  *G01B 7/00* (2006.01)
  *G05G 9/047* (2006.01)
  *G05G 25/00* (2006.01)
  *F16H 59/02* (2006.01)
  *H01L 25/04* (2014.01)

(52) U.S. Cl.
  CPC .............. *G01B 7/00* (2013.01); *G05G 9/047* (2013.01); *G05G 25/00* (2013.01); *H01L 25/04* (2013.01); *G05G 2009/04718* (2013.01); *G05G 2009/04755* (2013.01)

(58) Field of Classification Search
  CPC  G05G 2009/0474–04781; G01L 5/223; G01L 5/22; G01L 5/16
  See application file for complete search history.

(56) References Cited

U.S. PATENT DOCUMENTS

| | | | | |
|---|---|---|---|---|
| 5,140,320 A * | 8/1992 | Gerbier | ............... | B25J 13/02 250/231.1 |
| 5,295,513 A * | 3/1994 | Hori | ............... | F15B 13/0424 137/557 |
| 5,399,967 A | 3/1995 | Carscadden | | |
| 5,532,476 A * | 7/1996 | Mikan | ............... | G01D 5/30 250/221 |
| 5,597,261 A * | 1/1997 | Hayashi | ............... | F16D 3/04 403/291 |
| 5,598,090 A * | 1/1997 | Baker | ............... | G05G 9/047 273/148 B |
| 5,691,637 A * | 11/1997 | Oswald | ............... | G01B 7/004 324/207.2 |
| 5,714,980 A * | 2/1998 | Niino | ............... | G05G 9/047 345/157 |
| 5,831,596 A | 11/1998 | Marshall et al. | | |
| 5,868,230 A * | 2/1999 | Chatterjea | ............... | B62D 11/183 137/636.2 |
| 5,969,520 A * | 10/1999 | Schottler | ............... | G01D 5/145 200/6 A |
| 6,328,127 B1 * | 12/2001 | Hori | ............... | B62D 11/183 180/333 |
| 6,460,639 B1 * | 10/2002 | Hori | ............... | B62D 11/183 180/333 |
| 6,611,140 B1 | 8/2003 | Bloechl et al. | | |
| 6,810,336 B2 * | 10/2004 | Nakane | ............... | G01L 3/104 702/151 |
| 6,817,261 B2 * | 11/2004 | Mototani | ............... | F15B 13/0422 200/6 A |
| 6,992,602 B2 * | 1/2006 | Alexander | ............... | G05G 9/047 318/560 |
| 7,411,521 B2 * | 8/2008 | Lewis | ............... | G05G 9/047 200/6 A |
| 7,467,644 B2 * | 12/2008 | Blanco | ............... | F15B 13/0422 137/554 |
| 8,039,767 B2 * | 10/2011 | Saomoto | ............... | G05G 5/05 200/18 |
| 8,106,650 B2 * | 1/2012 | Arns | ............... | F15B 15/2846 324/207.25 |
| 8,453,523 B2 * | 6/2013 | Sato | ............... | G01L 5/164 73/862.69 |
| 8,531,182 B2 * | 9/2013 | Banerjee | ............... | G05G 9/047 324/160 |
| 8,661,918 B2 * | 3/2014 | Ohta | ............... | B25J 13/085 73/1.08 |
| 9,027,417 B2 * | 5/2015 | Sato | ............... | G01L 1/04 73/862.642 |
| 9,027,597 B2 * | 5/2015 | Kubo | ............... | E02F 9/2004 137/625.25 |
| 10,215,550 B2 * | 2/2019 | Metivier | ............... | G01B 7/30 |
| 10,230,006 B2 * | 3/2019 | Vig | ............... | G01R 33/0052 |
| 10,916,665 B2 * | 2/2021 | Vig | ............... | G01R 33/0047 |
| 2004/0164729 A1 * | 8/2004 | Ikeda | ............... | G01D 5/145 324/207.21 |
| 2006/0232268 A1 | 10/2006 | Arns et al. | | |
| 2015/0100160 A1 * | 4/2015 | Arai | ............... | B25J 9/1612 700/258 |
| 2015/0345991 A1 * | 12/2015 | Kageyama | ............... | F15B 13/0424 324/207.13 |
| 2019/0333720 A1 * | 10/2019 | Ka | ............... | G05G 5/03 |

FOREIGN PATENT DOCUMENTS

| | | |
|---|---|---|
| CN | 104736910 A | 6/2015 |
| EP | 0306178 A2 | 3/1989 |
| JP | 06-026805 A | 2/1994 |
| JP | 2000-154885 A | 6/2000 |
| JP | 2007-107696 A | 4/2007 |
| JP | 2008-536145 A | 9/2008 |
| WO | 2015/056595 A1 | 4/2015 |

\* cited by examiner

OPERATION LEVER

FIELD

The present invention relates to an operation lever.

BACKGROUND

An operation lever for operating a working equipment such as a bulldozer includes: an operation lever capable of tilting; and a stroke detection device which outputs a detection signal in accordance with an operation state of the operation lever. The operation lever is attached to the stroke detection device via a transmission device such as a universal joint. The operation lever can be tilted in an arbitrary direction with respect to the stroke detection device. A disk is attached to the operation lever so as to oppose the stroke detection device. An attitude of the disk is changed integrally with the operation lever.

In the stroke detection device, four rods are disposed in a portion opposing the disk. The four rods are disposed equidistant from each other in a circumferential direction on the same circumference about a predetermined central axis. The four rods are pushed and moved in an axial direction of a central axis by the disk as the attitude of the disk changes. Each of the rods is provided with a magnet that moves integrally with the rod. Each of the magnets moves integrally with the rod. In addition, the stroke detection device includes a magnetic sensor which detects a magnetic field of each of the magnets. The magnetic sensor outputs an electric signal corresponding to the magnitude of the detected magnetic field.

In the operation lever configured as described above, each of the rods of the stroke detection device is disposed at a reference position in a state where the operation lever is disposed at a neutral position. When the operation lever is tilted from this state, the attitude of the disk changes, and the rod is pushed by the disk and strokes in the axial direction of the central axis with respect to the reference position. When the rod strokes, a position of the magnet with respect to the magnetic sensor changes in the axial direction, and thus, the magnetic field detected by the magnetic sensor changes. The stroke detection device outputs a detection result of the magnetic sensor as an electric signal. A stroke amount of the rod corresponds to the operation state such as a tilting direction and a tilting amount of the operation lever. Therefore, the stroke detection device is capable of outputting the electric signal corresponding to the operation state of the operation lever (for example, see Patent Literature 1).

CITATION LIST

Patent Literature

Patent Literature 1: Japanese Patent Application Laid-Open No. 2007-107696 A

SUMMARY

Technical Problem

The operation lever described above is required to reduce erroneous detection in order to operate the working equipment with high accuracy.

The present invention has been made in view of the above circumstances, and an object thereof is to provide an operation lever capable of reducing erroneous detection.

Solution to Problem

According to a first aspect of the present invention, an operation lever comprises: a pair of rods disposed at point-symmetrical positions with respect to an operation axis; magnets disposed on the respective rods; and a pair of magnetic sensors disposed at line-symmetrical positions with respect to a second straight line perpendicular to a first straight line connecting centers of one of the rods and the other rod, on a plane perpendicular to the operation axis.

Advantageous Effects of Invention

According to the present invention, it is possible to provide the stroke detection device and the operation lever capable of reducing erroneous detection.

DESCRIPTION OF EMBODIMENTS

Hereinafter, embodiments of an operation lever according to the present invention will be described based on the drawings. Incidentally, the invention is not limited by the embodiments. In addition, constituent elements in the following embodiments include those that can be easily replaced by those skilled in the art, or those that are substantially the same.

First Embodiment

Figure 1:
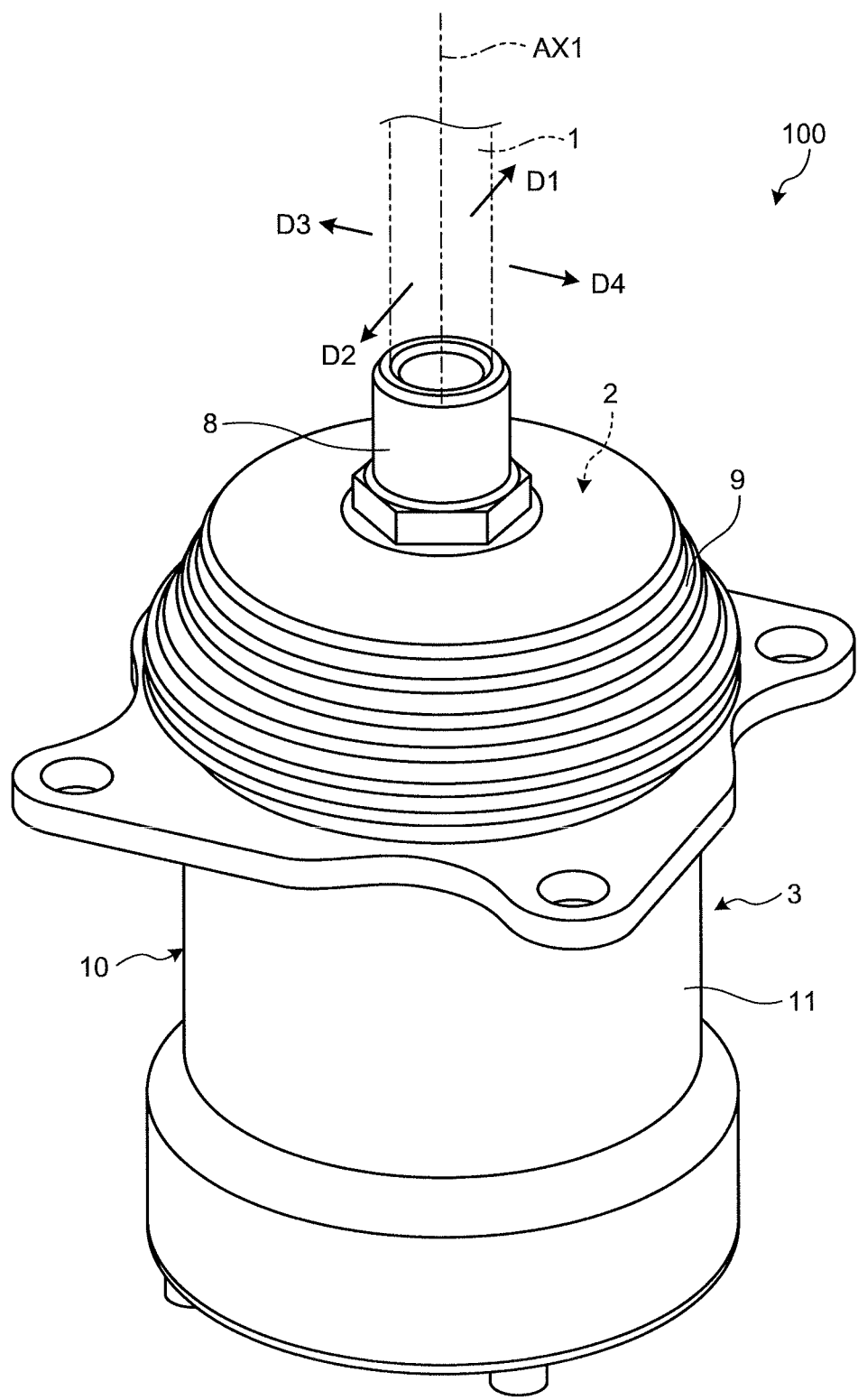
FIG. 1 is a perspective view illustrating an example of an operation lever according to a first embodiment.

FIG. 1 is a perspective view illustrating an example of an operation lever 100 according to a first embodiment. The operation lever 100 includes a lever portion 1, a transmission device 2, and a stroke detection device 3. When the lever portion 1 is operated, the operation lever 100 transmits an operation state to the stroke detection device 3 via the transmission device 2 and outputs a detection signal to detect the operation state from the stroke detection device 3. In the present embodiment, the operation lever 100 is installed in a construction machine. An example of such a construction machine is an information and communication technology (ICT) construction machine such as an ICT bulldozer. When installed in the ICT bulldozer, the operation lever 100 can be used, for example, at the time of raising and lowering and tilting a blade.

The lever portion 1 is provided in an upright attitude in the case of being disposed at a neutral position, for example. In a state where a worker is seated in a driver's seat of working equipment (not illustrated), the lever portion 1 is operated by being tilted from the neutral position in each direction, for example, a first direction D1 which is the front side, a second direction D2 which is the rear side, a third direction D3 which is the left side, and a fourth direction D4 which is the right direction. The first direction D1 and the second direction D2 are opposite directions with respect to the neutral position. The third direction D3 and the fourth direction D4 are opposite directions with respect to the neutral position. The first direction D1 and the second direction D2, and the third direction D3 and the fourth direction D4 are orthogonal to each other.

The lever portion 1 is inserted into one end side of a tubular coupling member 8. The coupling member 8 is attached to a boot 9. The boot 9 connects the lever portion 1 and the stroke detection device 3 so as to cover the transmission device 2. The boot 9 is formed in a bellows shape, for example. The boot 9 can be deformed in accordance with the attitude of the lever portion 1.

Figure 2:
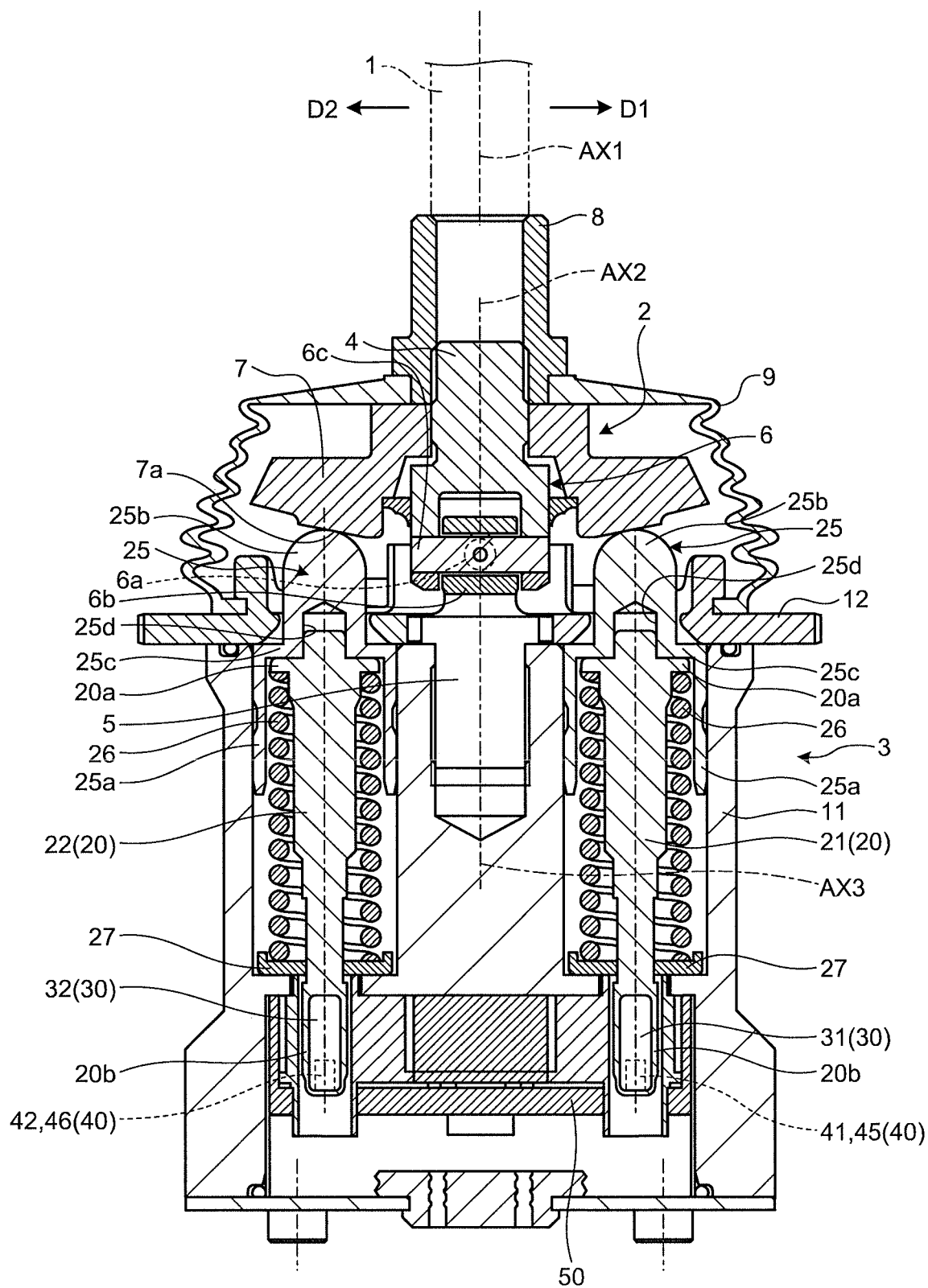
FIG. 2 is a cross-sectional view illustrating an example of the operation lever.
Figure 3:
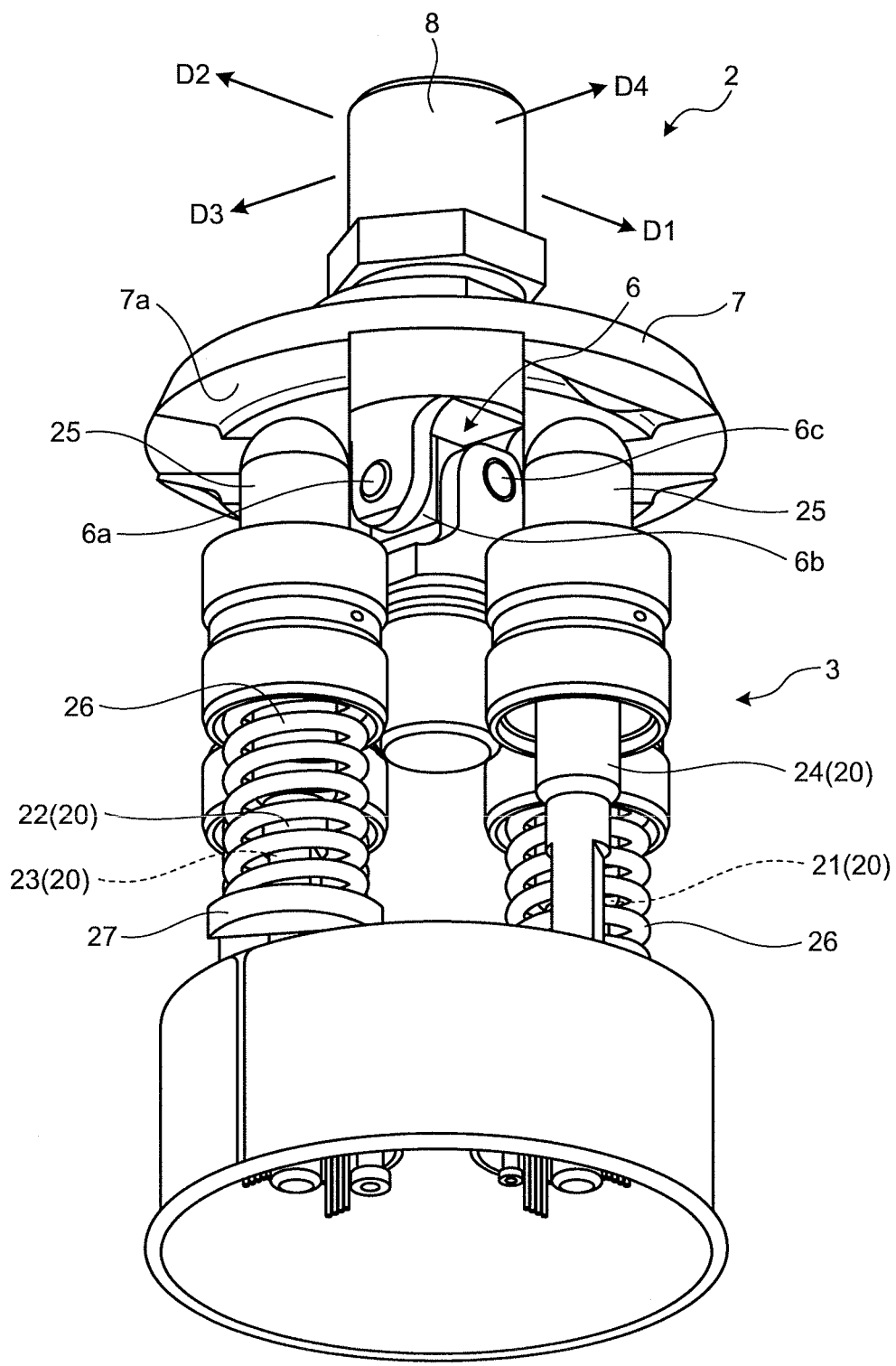
FIG. 3 is a perspective view illustrating an example of a transmission device and a stroke detection device.

FIG. 2 is a cross-sectional view illustrating an example of the operation lever 100. FIG. 2 illustrates an example in a case where the lever portion 1 is disposed at the neutral position. FIG. 2 illustrates an example when the operation lever 100 is cut with a plane passing through an operation axis AX1 of the lever portion 1 disposed at the neutral position and parallel to the first direction D1 and the second direction D2. FIG. 3 is a perspective view illustrating an example of the transmission device 2 and the stroke detection device 3.

As illustrated in FIGS. 2 and 3, the transmission device 2 includes a coupling shaft 4, a support shaft 5, a universal joint 6, and a disk 7. The coupling shaft 4 is inserted into the other end side of the coupling member 8. The coupling shaft 4 is connected to the lever portion 1 by the coupling member 8 and tilts integrally with the lever portion 1. A central axis AX2 of the coupling shaft 4 coincides with the operation axis AX1 of the lever portion 1. The support shaft 5 is fixed to a plate 12 (to be described later) of the stroke detection device 3 by a fixing member (not illustrated). When the lever portion 1 is disposed at the neutral position, an operation axis AX3 of the support shaft 5 coincides with the operation axis AX1 of the lever portion 1 and the central axis AX2 of the coupling shaft 4.

The universal joint 6 connects the coupling shaft 4 and the support shaft 5. The universal joint 6 has a first shaft member 6a, a rotating member 6b, and a second shaft member 6c. The first shaft member 6a is formed in, for example, a cylindrical shape and fixed to the support shaft 5. The first shaft member 6a is disposed to be orthogonal to an axial direction of the operation axis AX3 of the support shaft 5. In the present embodiment, the first shaft member 6a is disposed in a direction parallel to the third direction D3 and the fourth direction D4, for example. The rotating member 6b is formed into, for example, a quadrangular prism shape and is supported so as to be rotatable about an axis of the first shaft member 6a. The rotating member 6b is disposed in a state where opposing planes are penetrated by the first shaft member 6a.

The second shaft member 6c is formed in, for example, a cylindrical shape and fixed to the coupling shaft 4. The second shaft member 6c is disposed to be orthogonal to the axial direction of the operation axis AX3 of the support shaft 5 and orthogonal to an axial direction of the first shaft member 6a. In the present embodiment, the second shaft member 6c is disposed, for example, in a direction parallel to the first direction D1 and the second direction D2. The second shaft member 6c is supported to be rotatable about the axis of the second shaft member 6c by the rotating member 6b.

The first shaft member 6a and the second shaft member 6c are disposed on the same plane perpendicular to the axial direction of the operation axis AX3 of the support shaft 5. The axis of the first shaft member 6a and the axis of the second shaft member 6b intersect each other at the operation axis AX3. Thus, one of the first shaft member 6a and the second shaft member 6c is disposed in the state of penetrating through a central portion in the axial direction, and the other is disposed in the state of being open at a center portion in the axial direction.

The lever portion 1 can be tilted by the universal joint 6 in an arbitrary direction among the first direction D1, the second direction D2, the third direction D3, and the fourth direction D4.

The disk 7 is fixed to an outer periphery of the coupling shaft 4. The disk 7 has, for example, a disk shape. The disk 7 has an opposing surface 7a which opposes protruding portion 25b of four pistons 25, which will be described later, in the stroke detection device 3. When the lever portion 1 is in the upright attitude, the opposing surface 7a abuts on distal ends of the four protruding portions 25b. When the lever portion 1 is tilted, the opposing surface 7a tilts with respect to a plane perpendicular to the operation axis AX3 in conjunction with the movement of the lever portion 1.

The stroke detection device 3 includes a device body 10, rods 20, magnets 30, magnetic sensors 40, and a circuit board 50. Incidentally, FIG. 3 does not illustrate the device body 10.

The device body 10 has a housing 11 and a plate 12. The housing 11 is, for example, a tubular shape, and accommodates the rod 20, the magnet 30, the magnetic sensor 40, and the circuit board 50. Although a central axis of the housing 11 coincides with, for example, the operation axis AX3 of the support shaft 5 in the present embodiment, the invention is not limited thereto. The plate 12 is disposed so as to block an end portion of the housing 11 on the lever portion 1 side in the axial direction of the central axis. The support shaft 5 of the transmission device 2 is fixed to the plate 12. The plate 12 has a through-hole penetrating through the support shaft 5 and a through-hole penetrating through the piston 25 to be described later.

For example, the four rods 20 are provided. The four rods 20 are disposed on the same circumference about the central axis of the housing 11 (the operation axis AX3 of the support shaft 5) which is a predetermined central axis in the device body 10. The four rods 20 are disposed at equal intervals in a direction about the axis of the operation axis AX3. Hereinafter, the four rods 20 will be described as the rod 20 when the description is given without distinguishing the four rods 20, and will be described as "rods 21, 22, 23, and 24" with different reference signs when the description is given by distinguishing the four rods 20 from each other. When distinguishing the four rods 20, for example, the rod 21 is disposed on the first direction D1 side with respect to the central axis AX. The rod 22 is disposed on the second direction D2 side with respect to the central axis AX. The rod 23 is disposed on the third direction D3 side with respect to the central axis AX. The rod 24 is disposed on the fourth direction D4 side with respect to the central axis AX. Each of the rods 20 is provided to be movable along the axial direction of the central axis AX.

Each of the rods 20 has a flange portion 20a and a magnet holding portion 20b. The flange portion 20a is disposed on the lever portion 1 side in the axial direction of the operation axis AX3, and one end of a spring member 26 abuts on the flange portion 20a. The magnet holding portions 20b are disposed on the circuit board 50 side in the axial direction of the operation axis AX3, and hold the magnets 30, respectively, which will be described later. The magnet holding portion 20b can move to penetrate through the circuit board 50 in a direction parallel to the axial direction of the operation axis AX3.

Each of the rods 20 is attached to the housing 11 via the piston 25, the spring member 26, and the spring receiving member 27. The piston 25 has a tubular portion 25a and the protruding portion 25b. The tubular portion 25a is, for example, a tubular shape and disposed inside the housing 11. The protruding portion 25b penetrates the through-hole of the plate 12 from an end portion 25c of the tubular portion 25a and protrudes to the lever portion 1 side. The distal end of the protruding portion 25b is, for example, a hemispherical shape. Incidentally, the distal end of the protruding portion 25b is not limited to the hemispherical shape and may have another shape. The protruding portion 25b is disposed such that the distal end thereof faces the opposing surface 7a of the disk 7. When the lever portion 1 is disposed at the neutral position, the four pistons 25 are disposed on the same plane in which the distal ends of the protruding portions 25b are perpendicular to the operation axis AX3. In this case, the distal end of each of the protruding portions 25b abuts on the opposing surface 7a of the disk 7.

A concave portion 25d is provided at the end portion 25c of the tubular portion 25a. An end portion of the rod 20 on the lever portion 1 side is inserted into the concave portion 25d. As the end portion of each of the rods 20 is inserted into the concave portion 25d, the rod 20 and each of the pistons 25 are integrated.

The spring member 26 is disposed in the state of being elastically deformed between the flange portion 20a of each of the rods 20 and the spring receiving member 27. The spring receiving member 27 is fixed to the housing 11. Therefore, each of the spring members 26 is disposed in the state of pushing the flange portion 20a to the lever portion 1 side by an elastic force. Therefore, the piston 25 is disposed in the state of being pushed to the lever portion 1 side by the spring member 26. For example, when no force is applied from the disk 7, the piston 25 is disposed in a state where the end portion 25c of the tubular portion 25a abuts on the plate 12 and the movement to the lever portion 1 side is restricted.

The magnets 30 are disposed on the magnet holding portions 20b of the four rods 20, respectively. Each of the magnets 30 is magnetized in the axial direction of the operation axis AX3. The magnet 30 moves integrally with the rod 20 as the rod 20 moves in the axial direction of the operation axis AX3. For example, as the magnet holding portion 20b of the rod 20 moves to penetrate through the circuit board 50, the magnet 30 moves to penetrate through the circuit board 50 together with the rod 20. Hereinafter, the four magnets 30 will be described as the magnet 30 when the description is given without distinguishing the magnets 30. In addition, when the description is given by distinguishing the four magnets 30 from each other, the magnet 30 held by the rod 21 will be expressed as a "magnet 31", the magnet 30 held by the rod 22 will be expressed as a "magnet 32", the magnet 30 held by the rod 23 will be expressed as a "magnet 33", and the magnet 30 held by the rod 24 will be expressed as a "magnet 34".

Figure 4:
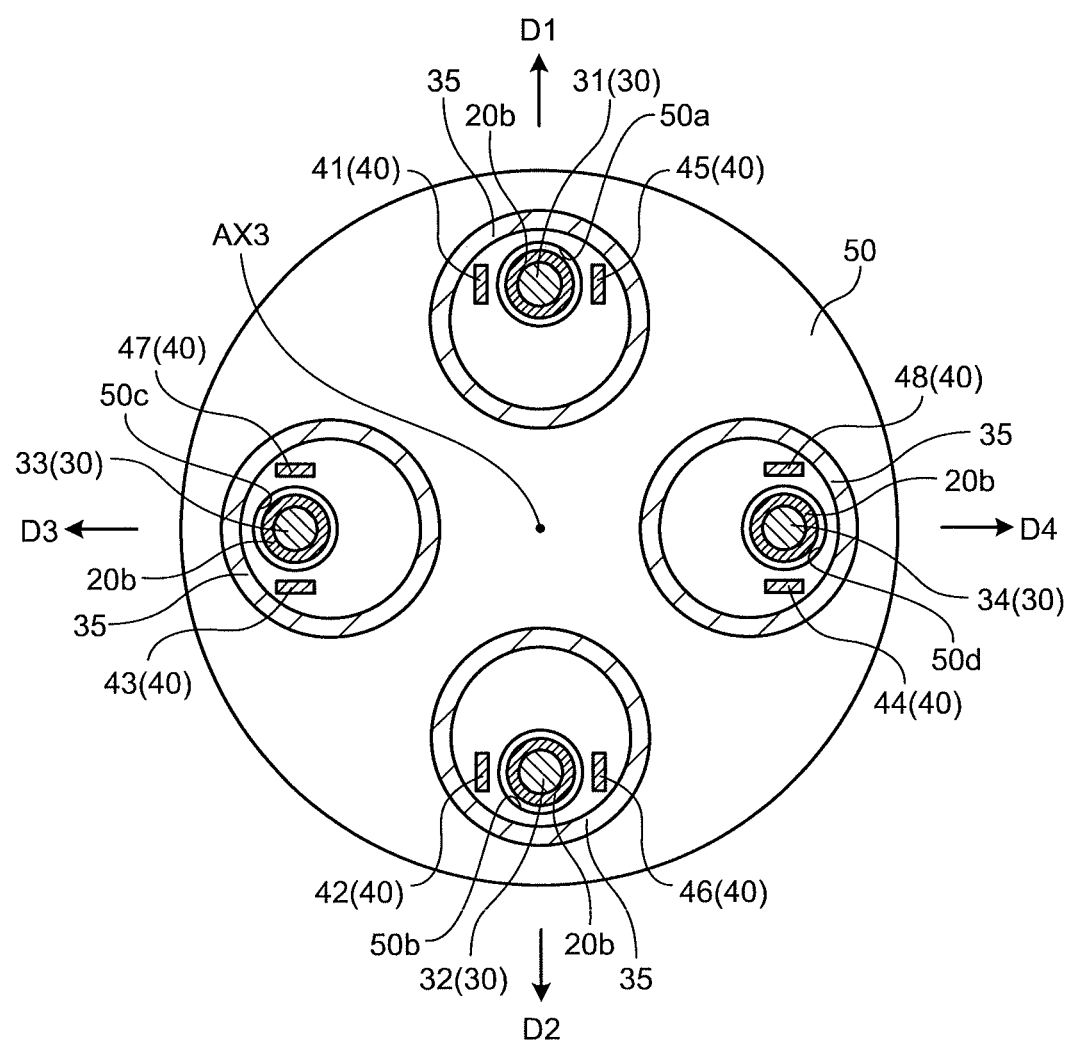
FIG. 4 is a view illustrating a configuration example when a circuit board is viewed from an axial direction of a central axis.
Figure 5:
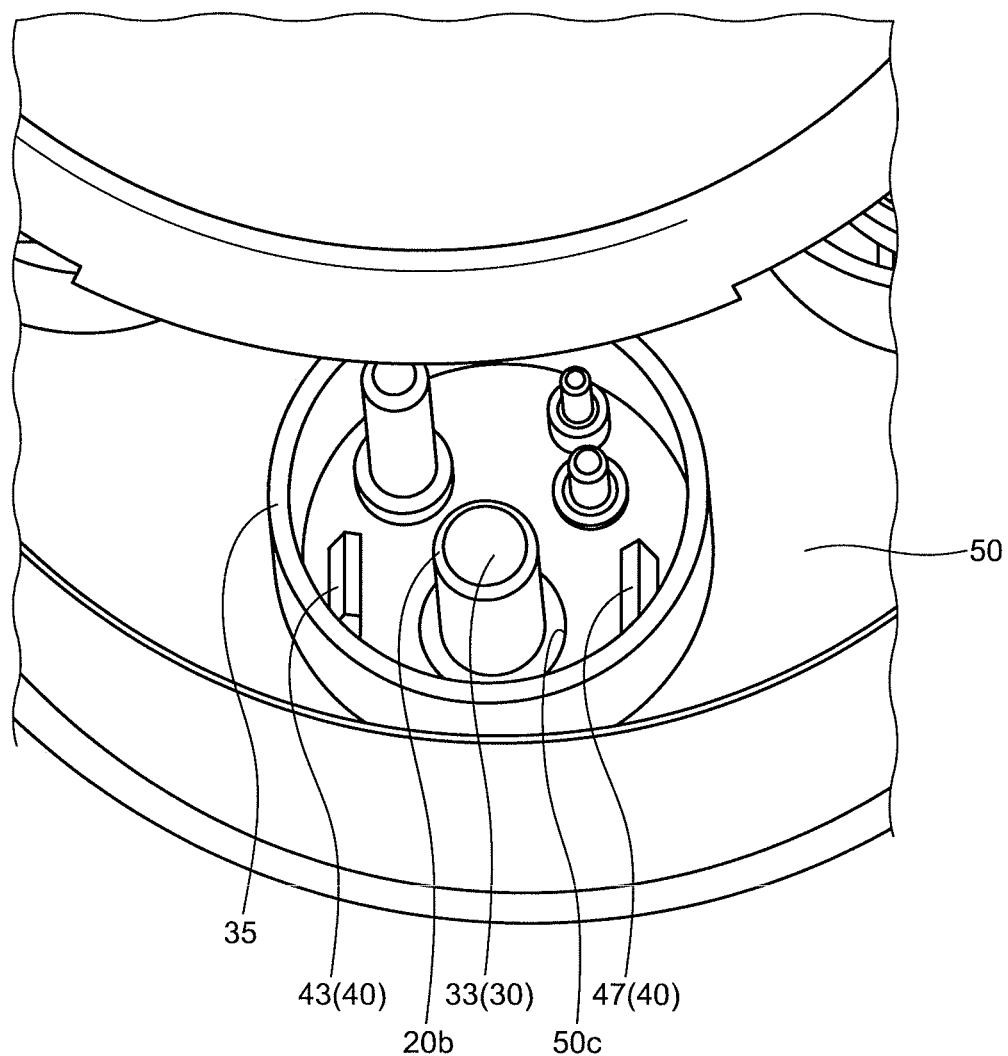
FIG. 5 is an enlarged perspective view of one magnet of the circuit board.

FIG. 4 is a view illustrating a configuration example when the circuit board 50 is viewed from the axial direction of the operation axis AX3. FIG. 5 is an enlarged perspective view of one magnet 30 (magnet 33) of the circuit board 50. FIG. 5 does not illustrate portions other than the magnet holding portion 20b of the rod 20. As illustrated in FIGS. 4 and 5, through-holes 50a, 50b, 50c, and 50d are formed in the circuit board 50. The through-hole 50a penetrates through the rod 21. The through-hole 50b penetrates through the rod 22. The through-hole 50c penetrates through the rod 23. The through-hole 50c penetrates through the rod 24.

A magnetic guide 35 is disposed on the circuit board 50. The magnetic guide 35 is formed in a tubular shape using a magnetic material, for example, and is disposed at a position surrounding the through-holes 50a, 50b, 50c, and 50d. Therefore, the magnetic guide 35 is disposed around a portion where each of the magnets 30 moves. When the rod 20 moves in the axial direction of the central axis AX, each of the magnets 30 moves inside the magnetic guide 35. The magnetic guide 35 guides a magnetic field of the inner magnet 30 to suppress the magnetic field of the magnet 30 from leaking to the outside of the magnetic guide 35.

Figure 6:
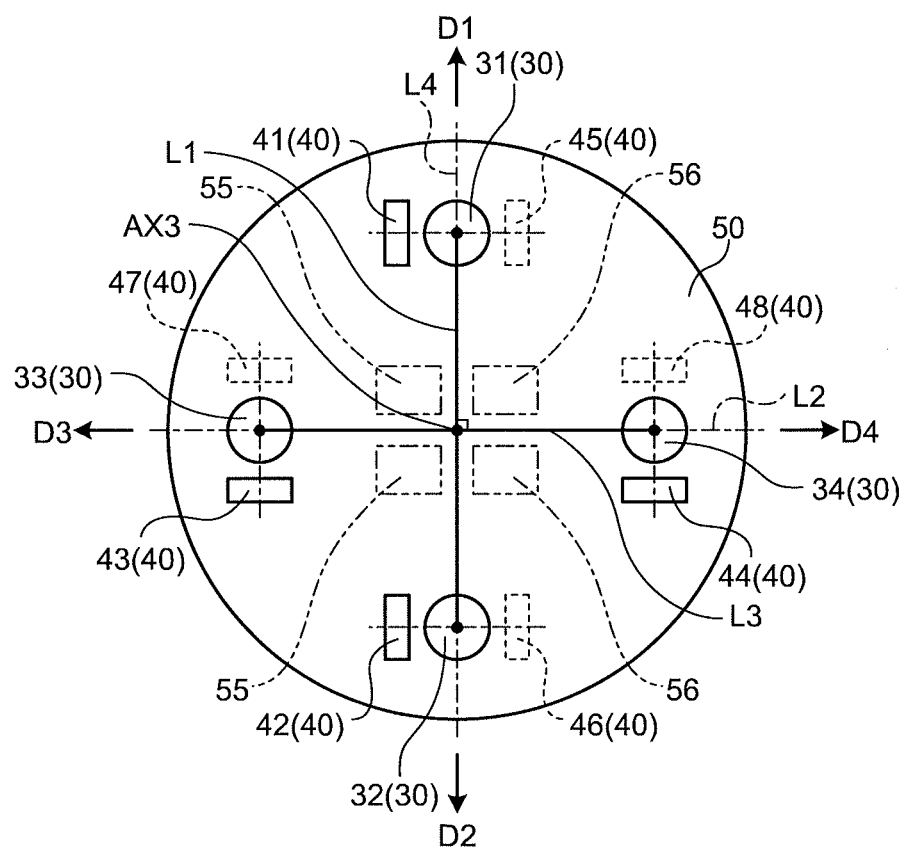
FIG. 6 is a view schematically illustrating an example of a positional relationship among magnets and magnetic sensors when viewed from the axial direction of the central axis.

FIG. 6 is a view schematically illustrating an example of a positional relationship among the magnets 30 and the magnetic sensors 40 when viewed from the axial direction of the operation axis AX3. As illustrated in FIG. 6, the magnet 31 and the magnet 32 among the four magnets 30 are disposed to oppose each other in a direction orthogonal to the operation axis AX3. In addition, the magnet 33 and the magnet 34 are disposed to oppose each other in the direction orthogonal to the operation axis AX3.

For example, the eight magnetic sensors 40 are disposed. The eight magnetic sensors 40 are mounted to the circuit board 50. The eight magnetic sensors 40 detect magnetic fields of the four magnets 30. For example, a Hall element or the like is used as the eight magnetic sensors 40. The magnetic sensor 40 detects a change in a direction of a magnetic field caused by displacement of the magnet 30, and outputs a detection result as an output signal. Hereinafter, the eight magnetic sensors 40 will be described as the magnetic sensor 40 when the description is given without distinguishing the magnetic sensors 40. When the description is given by distinguishing the eight magnetic sensors 40, the eight magnetic sensors 40 will be described as "magnetic sensors 41, 42, 43, 44, 45, 46, 47, and 48" with different reference signs.

Among the eight magnetic sensors 40, the magnetic sensors 41 and 45 detect a magnetic field of the magnet 31. The magnetic sensors 42 and 46 detect a magnetic field of the magnet 32. The magnetic sensors 43 and 47 detect a magnetic field of the magnet 33. The magnetic sensors 44 and 48 detect a magnetic field of the magnet 34. For example, the magnetic sensors 41, 42, 43, and 44 are used at normal time, and the magnetic sensors 45, 46, 47, and 48 are used as backups, for example, when a malfunction occurs in the magnetic sensor 44. In this case, for example, when a malfunction occurs in one of the magnetic sensors 41 and 42, the use of both of the magnetic sensors 41 and 42 is stopped and switched to the use of the magnetic sensors 45 and 46. Similarly, for example, when a malfunction occurs in one of the magnetic sensors 43 and 44, the use of both of the magnetic sensors 43 and 44 is stopped and switched to the use of the magnetic sensors 47 and 48.

When the circuit board 50 is viewed from the axial direction of the operation axis AX3, the magnetic sensor 41 is disposed to be aligned with respect to the magnet 31 in a direction parallel to a perpendicular bisector (second straight line) L2 of a line segment (first straight line) L1 connecting centers of the magnet 31 and the magnet 32. The line segment L1 and the perpendicular bisector L2 are imaginary lines. The magnetic sensor 42 is disposed to be aligned with respect to the magnet 32 in the direction parallel to the perpendicular bisector L2. In addition, the magnetic sensor 41 and the magnetic sensor 42 are disposed at line-symmetrical positions with respect to the perpendicular bisector L2.

The magnetic sensor 43 is disposed to be aligned with respect to the magnet 33 in a direction parallel to a perpendicular bisector (second straight line) L4 of a line segment (first straight line) L3 connecting centers of the magnet 33 and the magnet 34. The line segment L3 and the perpendicular bisector L4 are imaginary lines. The magnetic sensor 44 is disposed to be aligned with respect to the magnet 34 in the direction parallel to the perpendicular bisector L4. In addition, the magnetic sensor 43 and the magnetic sensor 44 are disposed at line-symmetrical positions with respect to the perpendicular bisector L4. Incidentally, the line segment L1 coincides with a part of the perpendicular bisector L4 in the present embodiment. In addition, the line segment L3 coincides with a part of the perpendicular bisector L2.

In addition, the magnetic sensor 45 is disposed to be aligned with respect to the magnet 31 in the direction parallel to the perpendicular bisector L2 and on the side opposite to the magnetic sensor 41. Therefore, the magnetic sensor 41 and the magnetic sensor 45 are disposed on both sides in the direction parallel to the perpendicular bisector L2 with respect to the single magnet 31. The magnetic sensor 46 is disposed to be aligned with respect to the magnet 32 to be parallel to the perpendicular bisector L2 and on the side opposite to the magnetic sensor 42. Therefore, the magnetic sensor 42 and the magnetic sensor 46 are disposed on both sides in the direction parallel to the perpendicular bisector L2 with respect to the single magnet 32. In addition, the magnetic sensor 45 and the magnetic sensor 46 are disposed at line-symmetrical positions with respect to the perpendicular bisector L2.

The magnetic sensor 47 is disposed to be aligned with respect to the magnet 33 in the direction parallel to the perpendicular bisector L4 and on the side opposite to the magnetic sensor 43. Therefore, the magnetic sensor 43 and the magnetic sensor 47 are disposed on both sides in the direction parallel to the perpendicular bisector L2 with respect to the single magnet 33. The magnetic sensor 48 is disposed to be aligned with respect to the magnet 34 to be parallel to the perpendicular bisector L4 and on the side opposite to the magnetic sensor 44. Therefore, the magnetic sensor 44 and the magnetic sensor 48 are disposed on both sides in the direction parallel to the perpendicular bisector L4 with respect to the single magnet 34. In addition, the magnetic sensor 47 and the magnetic sensor 48 are disposed at line-symmetrical positions with respect to the perpendicular bisector L4.

Figure 7:
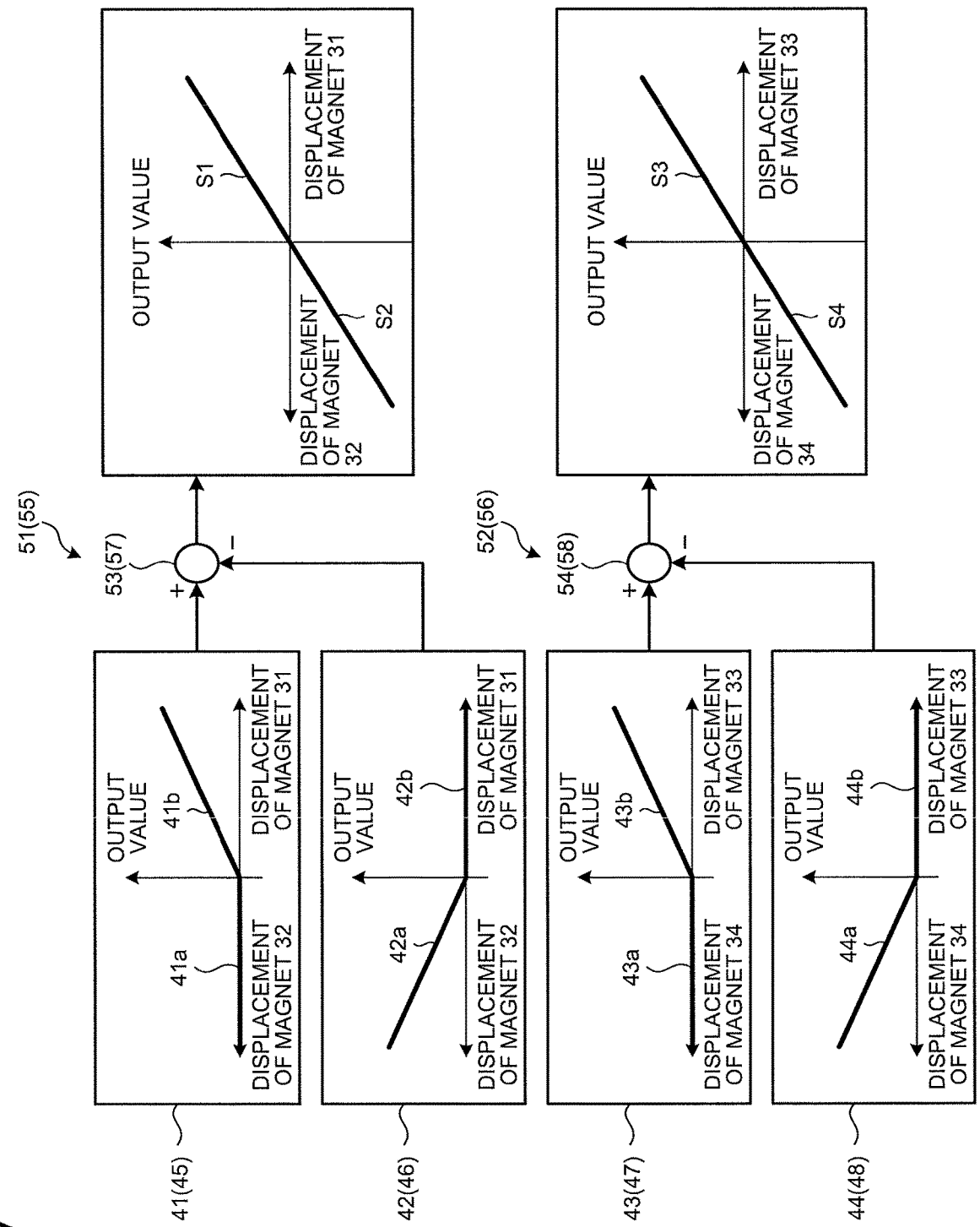
FIG. 7 is a block diagram illustrating examples of the magnetic sensor and a processing unit.

FIG. 7 is a block diagram illustrating examples of the magnetic sensor and a processing unit. In FIG. 7, output values of the magnetic sensors 41, 42, 43, and 44 are illustrated by graphs. In the graphs for the magnetic sensors 41 and 42, the vertical axis indicates an output value, the right direction on the horizontal axis indicates the displacement of the magnet 31, and the left direction on the horizontal axis indicates the displacement of the magnet 32. In addition, in the graphs for the magnetic sensors 43 and 44, the vertical axis indicates an output value, the right direction on the horizontal axis indicates the displacement of the magnet 33, and the left direction on the horizontal axis indicates the displacement of the magnet 34.

As illustrated in FIG. 7, the magnetic sensor 41 outputs a voltage signal having a reference voltage value as an output signal 41a when the magnet 31 is not displaced, that is, when the magnet 31 is held at a reference position. Incidentally, when the magnet 31 is not displaced, the magnetic sensor 41 outputs the voltage signal having the reference voltage value as the output signal 41a regardless of the displacement of the magnet 32. The reference voltage value can be set to, for example, 0 V. When the magnet 31 is displaced with respect to the reference position, the magnetic sensor 41 outputs a voltage signal having a value corresponding to the magnitude of the displacement of the magnet 31 as an output signal 41b. The voltage value of the output signal 41b increases from the reference voltage value as the displacement of the magnet 31 increases, and the voltage value is maximized when the displacement of the magnet 31 is maximized. The voltage value of the output signal 41b decreases toward the reference voltage value as the displacement of the magnet 31 decreases, and the voltage value returns to the reference voltage value when the magnet 31 returns to the reference position.

In addition, the magnetic sensor 42 outputs a voltage signal having the reference voltage value as an output signal 42b when the magnet 32 is not displaced, that is, when the magnet 32 is held at a reference position. Incidentally, when the magnet 32 is not displaced, the magnetic sensor 42 outputs the voltage signal having the reference voltage value as the output signal 42b regardless of the displacement of the magnet 31. The reference voltage value can be set to, for example, 0 V. When the magnet 32 is displaced with respect to the reference position, the magnetic sensor 42 outputs a voltage signal having a value corresponding to the magnitude of the displacement of the magnet 32 as an output signal 42a. The voltage value of the output signal 42a increases from the reference voltage value as the displacement of the magnet 32 increases, and the voltage value is maximized when the displacement of the magnet 32 is maximized. The voltage value of the output signal 42a decreases toward the reference voltage value as the displacement of the magnet 32 decreases, and the voltage value returns to the reference voltage value when the magnet 32 returns to the reference position.

Similarly, the magnetic sensor 43 outputs a voltage signal having the reference voltage value as an output signal 43a when the magnet 33 is not displaced, that is, when the magnet 33 is held at a reference position. Incidentally, when the magnet 33 is not displaced, the magnetic sensor 43 outputs the voltage signal having the reference voltage value as the output signal 43a regardless of the displacement of the magnet 34. The reference voltage value can be set to, for example, 0 V. When the magnet 33 is displaced with respect to the reference position, the magnetic sensor 43 outputs a voltage signal having a value corresponding to the magnitude of the displacement of the magnet 33 as an output signal 43b. The voltage value of the output signal 43b increases from the reference voltage value as the displacement of the magnet 33 increases, and the voltage value is maximized when the displacement of the magnet 33 is maximized. The voltage value of the output signal 43b decreases toward the reference voltage value as the displacement of the magnet 33 decreases, and the voltage value returns to the reference voltage value when the magnet 33 returns to the reference position.

In addition, the magnetic sensor 44 outputs a voltage signal having the reference voltage value as an output signal 44b when the magnet 34 is not displaced, that is, when the magnet 34 is held at a reference position. Incidentally, when the magnet 34 is not displaced, the magnetic sensor 44 outputs the voltage signal having the reference voltage value as the output signal 44b regardless of the displacement of the magnet 33. The reference voltage value can be set to, for example, 0 V. When the magnet 34 is displaced with respect to the reference position, the magnetic sensor 44 outputs a voltage signal having a value corresponding to the magnitude of the displacement of the magnet 34 as an output signal 44a. The voltage value of the output signal 44a increases from the reference voltage value as the displacement of the magnet 34 increases, and the voltage value is maximized when the displacement of the magnet 34 is maximized. The voltage value of the output signal 44a decreases toward the reference voltage value as the displacement of the magnet 34 decreases, and the voltage value returns to the reference voltage value when the magnet 34 returns to the reference position.

Figure 8:
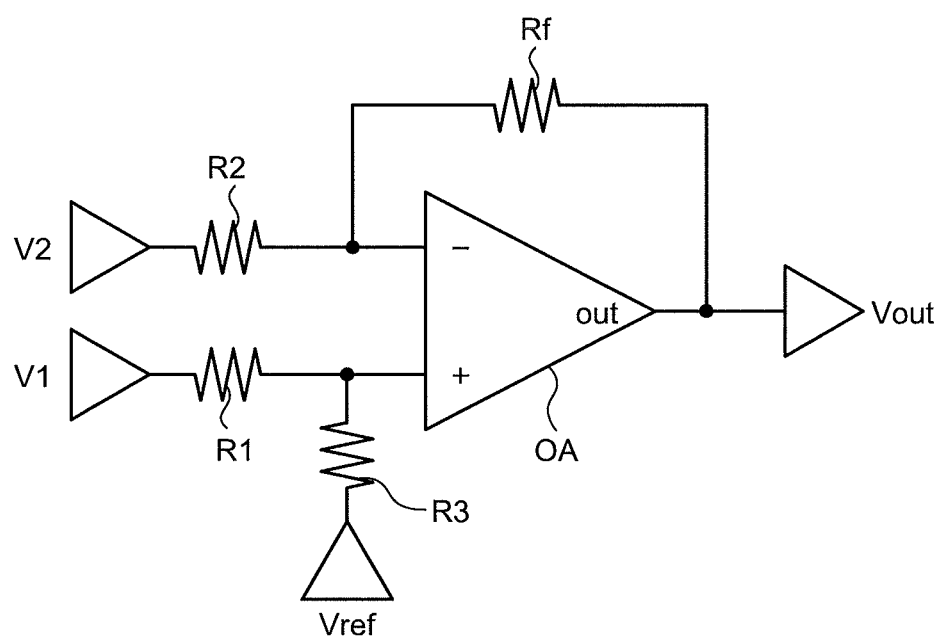
FIG. 8 is a circuit diagram illustrating an example of an arithmetic unit.

The circuit board 50 includes processing units 51 and 52. The processing unit 51 generates and outputs a detection signal based on output signals of the magnetic sensors 41 and 42. The processing unit 51 includes an arithmetic unit 53. The arithmetic unit 53 receives the output signals of the magnetic sensors 41 and 42. The arithmetic unit 53 subtracts the output signal of the magnetic sensor 42 from the output signal of the magnetic sensor 41, amplifies the subtraction value, and outputs the amplified value. FIG. 8 is a circuit diagram illustrating an example of the arithmetic unit 53. As illustrated in FIG. 8, it is possible to use, for example, a subtraction circuit, which includes resistors R1, R2, R3, and Rf and an operational amplifier OA, as the arithmetic unit 53. As an output signal V1 of the magnetic sensor 41 and an output signal V2 of the magnetic sensor 42 are input to the arithmetic unit 53, a detection signal Vout obtained by amplifying a difference between these output signals is output.

The processing unit 52 generates and outputs a detection signal based on detection results of the magnetic sensors 43 and 44. The processing unit 52 includes an arithmetic unit 54. The arithmetic unit 54 receives output signals of the magnetic sensors 43 and 44. The arithmetic unit 54 subtracts the output signal of the magnetic sensor 44 from the output signal of the magnetic sensor 43, amplifies a subtraction value, and outputs the amplified value. It is possible to use a circuit similar to the subtraction circuit illustrated in FIG. 8 as the arithmetic unit 54.

In addition, the circuit board 50 includes: a processing unit 55 which generates and outputs a detection signal based on output signals of the magnetic sensors 45 and 46; and a processing unit 56 which generates and outputs a detection signal based on output signals of the magnetic sensors 47 and 48. The processing unit 55 includes an arithmetic unit 57. The arithmetic unit 57 subtracts the output signal of the magnetic sensor 46 from the output signal of the magnetic sensor 45, amplifies a subtraction value, and outputs the amplified value. In addition, the processing unit 56 includes an arithmetic unit 58. The arithmetic unit 58 subtracts the output signal of the magnetic sensor 48 from the output signal of the magnetic sensor 47, amplifies a subtraction value, and outputs the amplified value. It is possible to use a circuit similar to the subtraction circuit illustrated in FIG. 8 as the arithmetic units 57 and 58.

Figure 9:
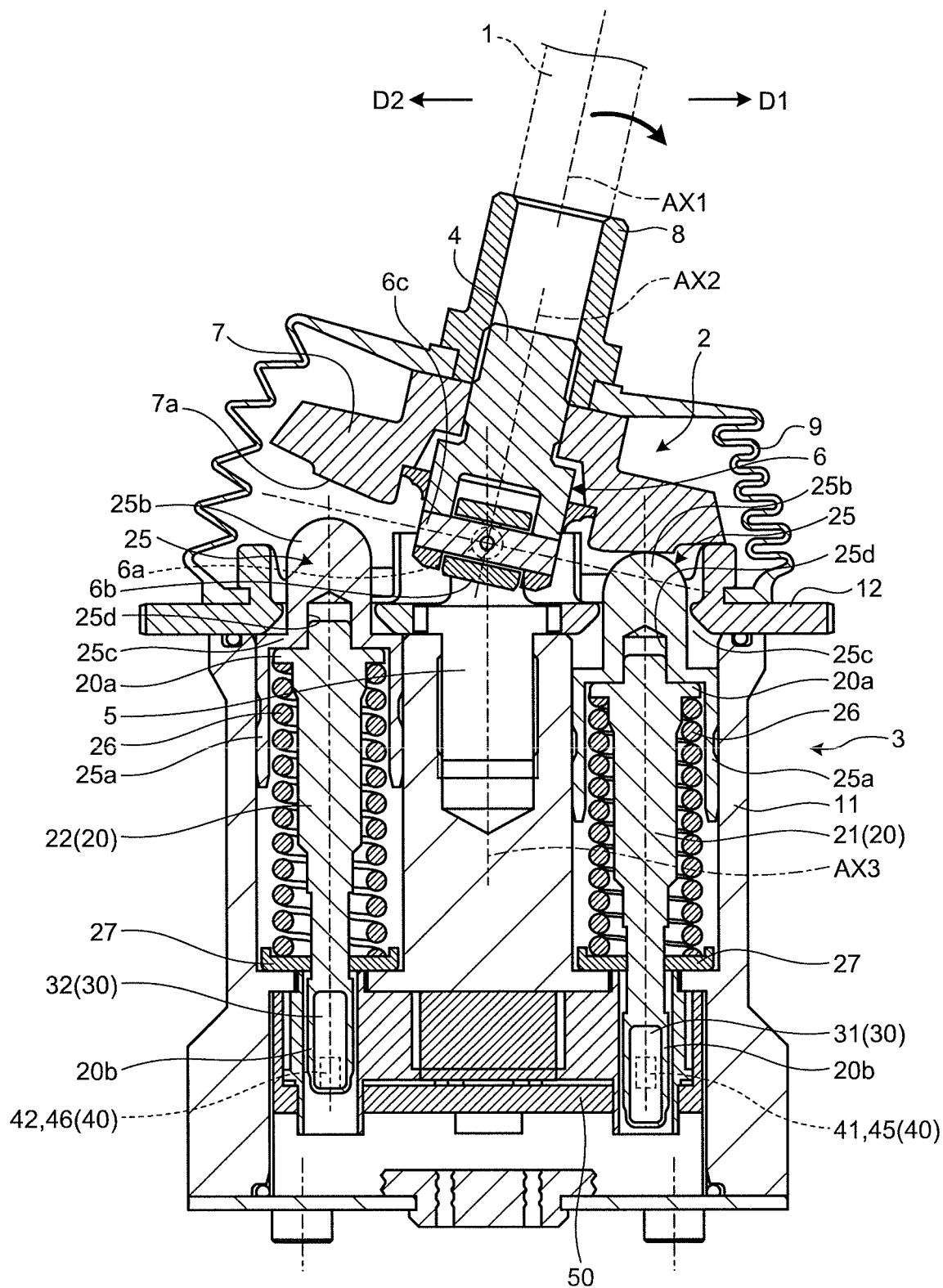
FIG. 9 is a cross-sectional view illustrating an example of a state where a lever portion is tilted in the operation lever.

FIG. 9 is a cross-sectional view illustrating an example of a state where the lever portion 1 is tilted in the operation lever 100. As illustrated in FIG. 9, for example, when the lever portion 1 is tilted in the first direction D1 with respect to the neutral position, a portion of the disk 7 on the first direction D1 side is tilted toward the stroke detection device 3, and a portion thereof on the second direction D2 side is tilted to the lever portion 1 side. Due to the tilting of the disk 7, the rod 21 disposed on the first direction D1 side with respect to the operation axis AX3 is pushed by the disk 7 to move to the circuit board 50 side. In addition, the portion of the disk 7 on the second direction D2 side is tilted toward the lever portion 1 side so that a gap is generated as the disk 7 is spaced apart from a distal end of the piston 25 disposed on the second direction D2 side with respect to the operation axis AX3. In this case, the rod 22 is kept at the reference position since a force pushing the rod 22 downward is not applied. In addition, an inclination of the disk 7 in the third direction D3 side and the fourth direction D4 side does not change. In this manner, when the lever portion 1 is tilted in the first direction D1, only the rod 21 is pushed down.

In addition, for example, when the lever portion 1 is tilted in the second direction D2 with respect to the neutral position, the portion of the disk 7 on the second direction D2 side is tilted to the stroke detection device 3 side, and the portion thereof on the first direction D1 side is tilted to the lever portion 1 side. Due to the tilting of the disk 7, the rod 22 disposed on the second direction D2 side with respect to the operation axis AX3 is pushed by the disk 7 to move to the circuit board 50 side. In addition, the portion of the disk 7 on the first direction D1 side is tilted toward the lever portion 1 side so that a gap is generated as the disk 7 is spaced apart from a distal end of the piston 25 disposed on the first direction D1 side with respect to the operation axis AX3. In this case, the rod 21 is kept at the reference position since a force pushing the rod 21 downward is not adopted. In addition, an inclination of the disk 7 in the third direction D3 side and the fourth direction D4 side does not change. In this manner, when the lever portion 1 is tilted in the second direction D2, only the rod 22 is pushed down.

Similarly, when the lever portion 1 is tilted in the third direction D3, only the rod 23 is pushed down. In addition, when the lever portion 1 is tilted in the fourth direction D4, only the rod 24 is pushed down. In addition, when the lever portion 1 is tilted in a direction between the first direction D1 and the fourth direction D4, the rod 21 and the rod 24 are pushed down. In addition, when the lever portion 1 is tilted in a direction between the second direction D2 and the third direction D3, the rod 22 and the rod 23 are pushed down. In addition, when the lever portion 1 is tilted in a direction between the first direction D1 and the third direction D3, the rod 21 and the rod 23 are pushed down. In addition, when the lever portion 1 is tilted in a direction between the second direction D2 and the third direction D4, the rod 22 and the rod 24 are pushed down.

Therefore, for example, when the lever portion 1 is tilted in the first direction D1 with respect to the neutral position, only the rod 21 is pushed down, and the magnet 31 moves integrally with the rod 21. Due to the movement of the magnet 31, the magnetic sensor 41 detects a change in the magnetic field and outputs the output signal 41b corresponding to the change in the magnetic field (see FIG. 7). In addition, there is no movement of the magnet 32, and the magnetic sensor 42 outputs the output signal 42b having the reference voltage value (see FIG. 7).

In this case, the output signal 41b of the magnetic sensor 41 and the output signal 42b of the magnetic sensor 42 are input to the arithmetic unit 53. The arithmetic unit 53 subtracts the output signal 42b from the output signal 41b, amplifies the subtraction value, and outputs the amplified value. The processing unit 51 outputs a signal output from the arithmetic unit 53 as a detection signal S1 (see FIG. 7). An output value of the detection signal S1 increases as the displacement of the magnet 31, that is, an inclination of the lever portion 1 in the first direction D1 is larger. In addition, the output value of the detection signal S1 decreases as the inclination of the lever portion 1 in the first direction D1 is smaller.

In addition, an inclination of the disk 7 in the third direction D3 side and the fourth direction D4 side does not change. Thus, the rod 23 disposed on the third direction D3 side with respect to the operation axis AX3 and the rod 24 disposed on the fourth direction D4 side with respect to the operation axis AX3 are kept at the reference positions without being pushed by the disk 7. Therefore, there is no movement of the magnets 33 and 34.

Meanwhile, there is a case where the magnetic sensors 43 and 44 detect a part of magnetic fields generated by the magnets 31, 32, 33, and 34 in the configuration of the present embodiment. For example, when the magnet 31 moves to the circuit board 50 side, the magnetic sensors 43 and 44 detect a part of the magnetic field generated by the magnet 31 in some cases.

Figure 10:
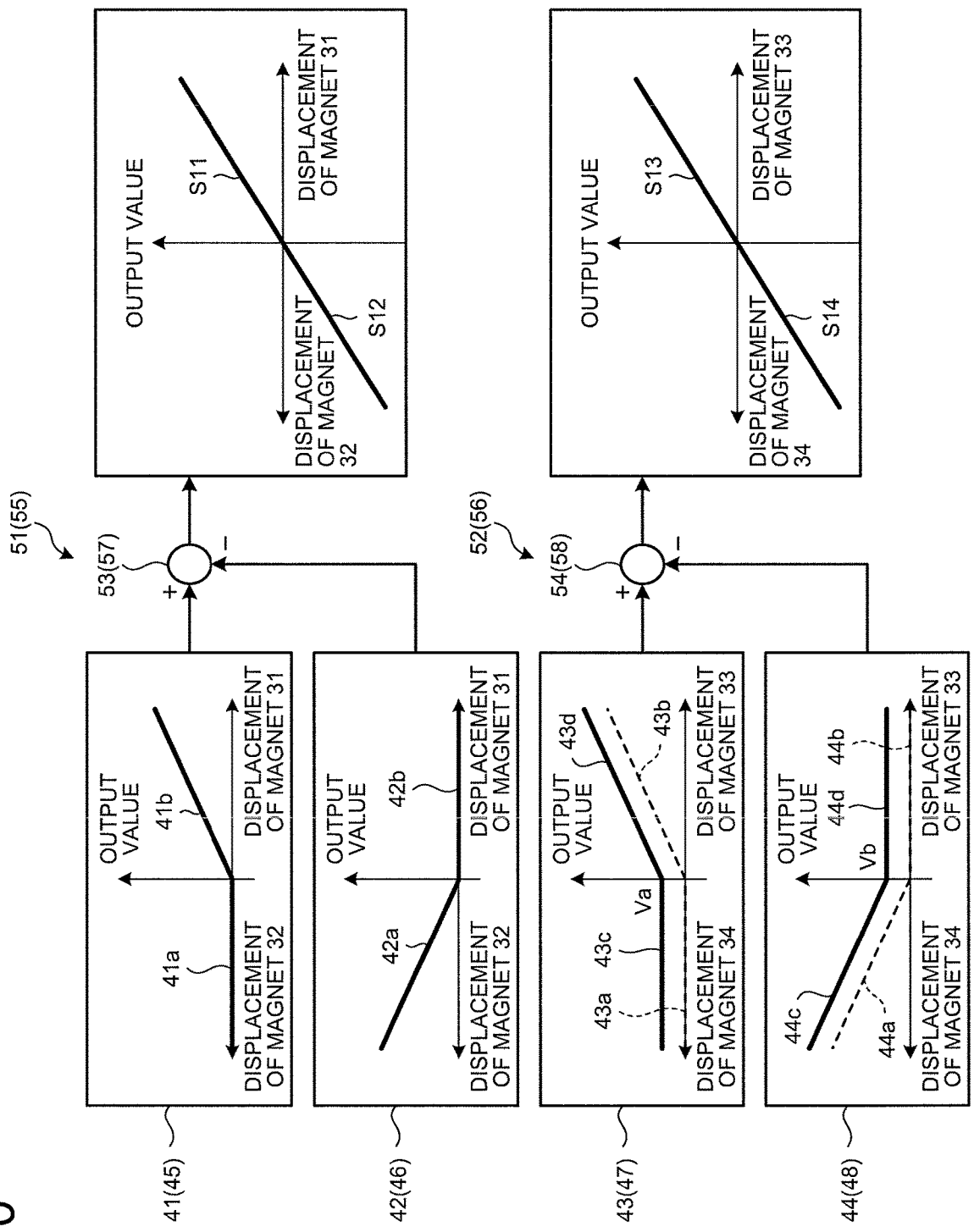
FIG. 10 is a block diagram illustrating examples of processing contents in the processing unit.

FIG. 10 is a block diagram illustrating examples of processing contents when the magnetic sensors 43 and 44 detect a part of the magnetic field generated by the magnet 31. The output values of the magnetic sensors 41, 42, 43, and 44 are illustrated by graphs in FIG. 10, which is similar to FIG. 7. In the graphs for the magnetic sensors 41 and 42, the vertical axis indicates an output value, the right direction on the horizontal axis indicates the displacement of the magnet 31, and the left direction on the horizontal axis indicates the displacement of the magnet 32. In addition, in the graphs for the magnetic sensors 43 and 44, the vertical axis indicates an output value, the right direction on the horizontal axis indicates the displacement of the magnet 33, and the left direction on the horizontal axis indicates the displacement of the magnet 34.

When detecting a part of the magnetic field generated by the magnet 31, the magnetic sensors 43 and 44 output output signals to which a voltage corresponding to the corresponding magnetic field is added as illustrated in FIG. 10. That is, the magnetic sensor 43 outputs output signals 43c and 43d obtained by adding a voltage Va to the output signals 43a and 43b, respectively. The magnetic sensor 44 outputs output signals 44c and 44d obtained by adding a voltage Vb to the output signals 44a and 44b, respectively.

In the configuration of the present embodiment, the magnetic sensor 43 and the magnetic sensor 44 are disposed at line-symmetrical positions with respect to the perpendicular bisector L4, and thus, have equal distance from the magnet 31. Therefore, the intensity of the magnetic field generated by the magnet 31 is theoretically equal between the position where the magnetic sensor 43 is disposed and the position where the magnetic sensor 44 is disposed. Thus, the magnetic sensors 43 and 44 detect the equal intensity of the magnetic field generated by the magnet 31. Accordingly, the voltage Va and the voltage Vb are equal to each other, and thus, the output signals 43c and 43d and the output signals 44c and 44d become equal voltage signals.

The output signals 43c and 43d of the magnetic sensor 43 and the output signals 44c and 44d of the magnetic sensor 44 are input to the arithmetic unit 54. The arithmetic unit 54 subtracts the output signals 44c and 44d from the output signals 43c and 43d, amplifies the subtraction values, and outputs the amplified values. Since the output signals 43c and 43d and the output signals 44c and 44d are the voltage signals having the equal value as described above, the voltage Va and the voltage Vb are canceled in the output result obtained by subtraction in the arithmetic unit 54.

As described above, the arithmetic unit 54 cancels the voltage Va and the voltage Vb corresponding to a part of the magnetic field generated by the magnet 31 out of the output signals 43c and 43d and the output signals 44c and 44d output from the magnetic sensors 43 and 44 by the calculation to output a detection signal S2. Thus, even when a part of the magnetic field generated by the magnet 31 is detected by the magnetic sensors 43 and 44, the processing unit 52 does not output the voltage Va and the voltage Vb corresponding to the part of the magnetic field of the output signals of the magnetic sensors 43 and 44.

In addition, for example, when the lever portion 1 is tilted in the second direction D2 with respect to the neutral position, only the rod 22 is pushed down, and the magnet 32 moves integrally with the rod 22. Due to the movement of the magnet 32, the magnetic sensor 42 detects a change in the magnetic field and outputs the output signal 42a corresponding to the change in the magnetic field (see FIG. 7). In addition, there is no movement of the magnet 31, and the magnetic sensor 41 outputs the output signal 41a having the reference voltage value (see FIG. 7).

The output signal 41a of the magnetic sensor 41 and the output signal 42a of the magnetic sensor 42 are input to the arithmetic unit 53. The arithmetic unit 53 subtracts the output signal 42a from the output signal 41a, amplifies the subtraction value, and outputs the amplified value. The processing unit 51 outputs a signal output from the arithmetic unit 53 as the detection signal S2 (see FIG. 7). The detection signal S2 has a negative value. An output value of the detection signal S2 decreases (an absolute value thereof increases) as the displacement of the magnet 32, that is, an inclination of the lever portion 1 in the second direction D2 is larger. In addition, the output value of the detection signal S2 increases (an absolute value thereof decreases) as the inclination of the lever portion 1 in the second direction D2 is smaller.

In addition, the inclination of the disk 7 in the third direction D3 side and the fourth direction D4 side does not change, and thus, the magnets 33 and 34 do not move. Meanwhile, there is a case where the magnetic sensors 43 and 44 detect a part of the magnetic field generated by the magnet 32 when the magnet 32 moves to the circuit board 50 side. When detecting a part of the magnetic field generated by the magnet 32, the magnetic sensors 43 and 44 output output signals to which a voltage corresponding to the corresponding magnetic field is added.

Since the magnetic sensor 43 and the magnetic sensor 44 are disposed at line-symmetrical positions with respect to the perpendicular bisector L4, and thus, have equal distance even from the magnet 32. Thus, even in the case of moving the magnet 32 by tilting the lever portion 1 in the second direction D2, the arithmetic unit 54 cancels voltages corresponding to a part of the magnetic field generated by the magnet 32 out of the output signals output from the magnetic sensors 43 and 44 similarly to the case of moving the magnet 31. Thus, even when a part of the magnetic field generated by the magnet 32 is detected by the magnetic sensors 43 and 44, the processing unit 52 does not output the voltages corresponding to the part of the magnetic field of the output signals of the magnetic sensors 43 and 44.

In addition, for example, when the lever portion 1 is tilted in the third direction D3 with respect to the neutral position, only the rod 23 is pushed by the disk 7 to move to the circuit board 50 side, and the magnet 33 moves integrally with the rod 23. Due to the movement of the magnet 33, the magnetic sensor 43 detects a change in the magnetic field and outputs the output signal 43b corresponding to the change in the magnetic field (see FIG. 7). When the portion of the disk 7 on the fourth direction D4 side is tilted to the lever portion 1 side, the rod 24 is kept in the state of being disposed at the reference position. Therefore, there is no movement of the magnet 34, and the magnetic sensor 44 outputs the output signal 44b having the reference voltage value (see FIG. 7).

In addition, for example, when the lever portion 1 is tilted in the fourth direction D4 with respect to the neutral position, only the rod 24 is pushed by the disk 7 to move to the circuit board 50 side, and the magnet 34 moves integrally with the rod 24. Due to the movement of the magnet 34, the magnetic sensor 44 detects a change in the magnetic field and outputs the output signal 44a corresponding to the change in the magnetic field (see FIG. 7). When the portion of the disk 7 on the third direction D3 side is tilted to the lever portion 1 side, the rod 23 is kept in the state of being disposed at the reference position. Therefore, there is no movement of the magnet 33, and the magnetic sensor 43 outputs the output signal 43a having the reference voltage value (see FIG. 7).

The output signals 43a and 43b of the magnetic sensor 43 and the output signals 44a and 44b of the magnetic sensor 44 are input to the arithmetic unit 54. The arithmetic unit 54 subtracts the output signals 44a and 44b from the output signals 43a and 43b, amplifies the subtraction values, and outputs the amplified values. The processing unit 52 outputs signals output from the arithmetic unit 54 as detection signal S3 and S4 (see FIG. 7). An output value of the detection signal S3 increases as the displacement of the magnet 33, that is, an inclination of the lever portion 1 in the third direction D3 is larger. In addition, the output value of the detection signal S3 decreases as the inclination of the lever portion 1 in the third direction D3 is smaller. In addition, the detection signal S4 has a negative value. An output value of the detection signal S4 decreases (an absolute value thereof increases) as the displacement of the magnet 34, that is, an inclination of the lever portion 1 in the fourth direction D4 is larger. In addition, the output value of the detection signal S4 increases (an absolute value thereof decreases) as the inclination of the lever portion 1 in the fourth direction D4 is smaller.

In addition, the magnetic sensor 41 and the magnetic sensor 42 are disposed at line-symmetrical positions with respect to the perpendicular bisector L2, and thus, have equal distance from the magnets 33 and 34. Thus, in the case of moving the magnets 33 and 34 by tilting the lever portion 1 in the third direction D3 and the fourth direction D4, the arithmetic unit 53 cancels the voltages corresponding to a part of the magnetic fields generated by the magnets 33 and 34 out of the output signals output from the magnetic sensors 41 and 42 by the calculation similarly to the above case.

In addition, the magnetic sensor 45 and the magnetic sensor 46 are disposed at line-symmetrical positions with respect to the perpendicular bisector L2, and thus, have equal distance from the magnets 33 and 34. Thus, in the case of moving the magnets 33 and 34, the arithmetic unit 57 cancels the voltages corresponding to a part of the magnetic fields generated by the magnets 33 and 34 out of the output signals output from the magnetic sensors 45 and 46 by the calculation similarly to the above case.

In addition, the magnetic sensor 47 and the magnetic sensor 48 are disposed at line-symmetrical positions with respect to the perpendicular bisector L4, and thus, have equal distance from the magnets 31 and 32. Thus, in the case of moving the magnets 31 and 32, the arithmetic unit 58 cancels the voltages corresponding to a part of the magnetic fields generated by the magnets 31 and 32 out of the output signals output from the magnetic sensors 47 and 48 similarly to the above case.

As described above, the operation lever 100 according to the present embodiment includes: the pair of rods 20 disposed at the point-symmetrical positions with respect to the operation axis AX3; the magnet 30 disposed on each of the rods 20; and the pair of magnetic sensors 40 disposed at the line-symmetrical positions with respect to the bisectors L2 and L4 perpendicular to the line segments L1 and L3 connecting the centers of one of the rods 20 and the other rod 20, on the plane perpendicular to the operation axis AX3.

Since the pair of magnetic sensors 40 are disposed at the line-symmetrical positions with respect to the perpendicular bisectors L2 and L4 in the operation lever 100, the distances from the magnets 30 disposed on the pair of rods 20 are equal to each other. Therefore, the intensity of the magnetic field generated by each of the magnets 30 is equal between the position where one of the magnetic sensors 40 is disposed and the position where the other magnetic sensor 40 is disposed. Thus, the one magnetic sensor 40 can detect the magnetic fields of the equal intensity for the magnetic field generated by the respective magnets 30 and output the voltage signals having the equal value. Thus, the operation lever 100 can output a component corresponding to the magnetic field of the magnet 30 which is an original detection target out of the output signals of the pair of magnetic sensors 40 and cancel a component corresponding to the magnetic field of the magnet 30 which is not the original detection object by generating the detection signal based on, for example, the output signal of the one magnetic sensor 40 and the output signal of the other magnetic sensor 40. As a result, the operation lever 100 can reduce erroneous detection without separately providing a magnetic shield or the like to the magnet 30. In addition, it is possible to save a space for providing the magnetic shield or the like in the operation lever 100, and thus, it is possible to suppress a size increase.

In addition, the operation lever 100 according to the present embodiment includes the pair of rods 20, the magnets 30, the pair of magnetic sensors 40, and the circuit board 50 which outputs the detection signal regarding the change in the relative position of each of the magnets 30 based on the output signals of the magnetic sensors 40.

As a result, the operation lever 100 can output a component corresponding to the magnetic field of the magnet 30 which is an original detection target out of the output signals of the pair of magnetic sensors 40 and cancel a component corresponding to the magnetic field of the magnet 30 which is not the original detection object by generating the detection signal based on the output signal of the one magnetic sensor 40 and the output signal of the other magnetic sensor 40 by the calculation of the circuit board 50.

In addition, in the operation lever 100, the processing unit 51 generates the detection signal based on the calculation result obtained by subtracting the detection result of the magnetic sensor 42 detecting the magnet 32 from the detection result of the magnetic sensor 41 detecting the magnet 31. In addition, the processing unit 52 generates the detection signal based on the calculation result obtained by subtracting the detection result of the magnetic sensor 44 detecting the magnet 34 from the detection result of the magnetic sensor 43 detecting the magnet 33. As a result, it is possible to reliably reduce erroneous detection without using complicated signal processing.

In addition, in the operation lever 100, the magnetic sensors 41 and 42 are disposed to be aligned with respect to the magnets 31 and 32, respectively, in the direction parallel to the perpendicular bisector L2. In addition, the magnetic sensors 43 and 44 are disposed to be aligned with respect to the magnets 33 and 34, respectively, in the direction parallel to the perpendicular bisector L4. As a result, the magnetic sensors 41, 42, 43, and 44 can detect the magnetic fields of the magnets 31, 32, 33, and 34 to be detected with high accuracy.

In addition, in the operation lever 100, the two magnetic sensors 40 are provided for the single magnet 30. For example, the two magnetic sensors 41 and 45 are provided for the single magnet 31. In addition, the two magnetic sensors 42 and 46 are provided for the single magnet 32. In addition, the two magnetic sensors 43 and 47 are provided for the single magnet 33. In addition, the two magnetic sensors 44 and 48 are provided for the single magnet 34. As a result, the redundancy of the magnetic sensor 40 can be secured. For example, one magnetic sensor 41, 42, 43 or 44 between the two magnetic sensors 40 can be used at normal time, and the other magnetic sensor 45, 46, 47, or 48 can be used as the backup.

In addition, in this case, the two magnetic sensors 41 and 45 provided for the single magnet 31 are disposed on both sides in the direction parallel to the perpendicular bisector L2 with respect to the magnet 31 to be detected. The two magnetic sensors 42 and 46 provided for the single magnet 32 are disposed on both sides in the direction parallel to the perpendicular bisector L2 with respect to the magnet 32 to be detected. The two magnetic sensors 43 and 47 provided for the single magnet 33 are disposed on both sides in the direction parallel to the perpendicular bisector L4 with respect to the magnet 33 to be detected. The two magnetic sensors 44 and 48 provided for the single magnet 34 are disposed on both sides in the direction parallel to the perpendicular bisector L4 with respect to the magnet 34 to be detected. As a result, the eight magnetic sensors 40 can be disposed compactly.

In addition, the two magnetic sensors 41 and 45 are disposed equidistant from the single magnet 31 to be detected in this case. The two magnetic sensors 42 and 46 are disposed equidistant from the single magnet 32 to be detected. The two magnetic sensors 43 and 47 are disposed equidistant from the single magnet 33 to be detected. The two magnetic sensors 44 and 48 are disposed equidistant from the single magnet 34 to be detected. As a result, it is possible to make the magnitudes of the output signals substantially equal between the magnetic sensor 41, 42, 43, or 44 and the magnetic sensor 45, 46, 47, or 48. As a result, it is possible to secure the redundancy of the magnetic sensor 40 without complicated signal processing.

Second Embodiment

Next, a second embodiment will be described. Although the description has been given in the first embodiment by exemplifying the configuration in which the detection signal is output in the processing units 51 and 52 based on the calculation result obtained by subtracting the output signal of the other magnetic sensor 40 from the output signal of the one magnetic sensor 40, the present embodiment adopts a configuration in which a detection signal is output based on a calculation result obtained by adding an output signal of one of the magnetic sensors 40 and an output signal of the other magnetic sensor 40.

Figure 11:
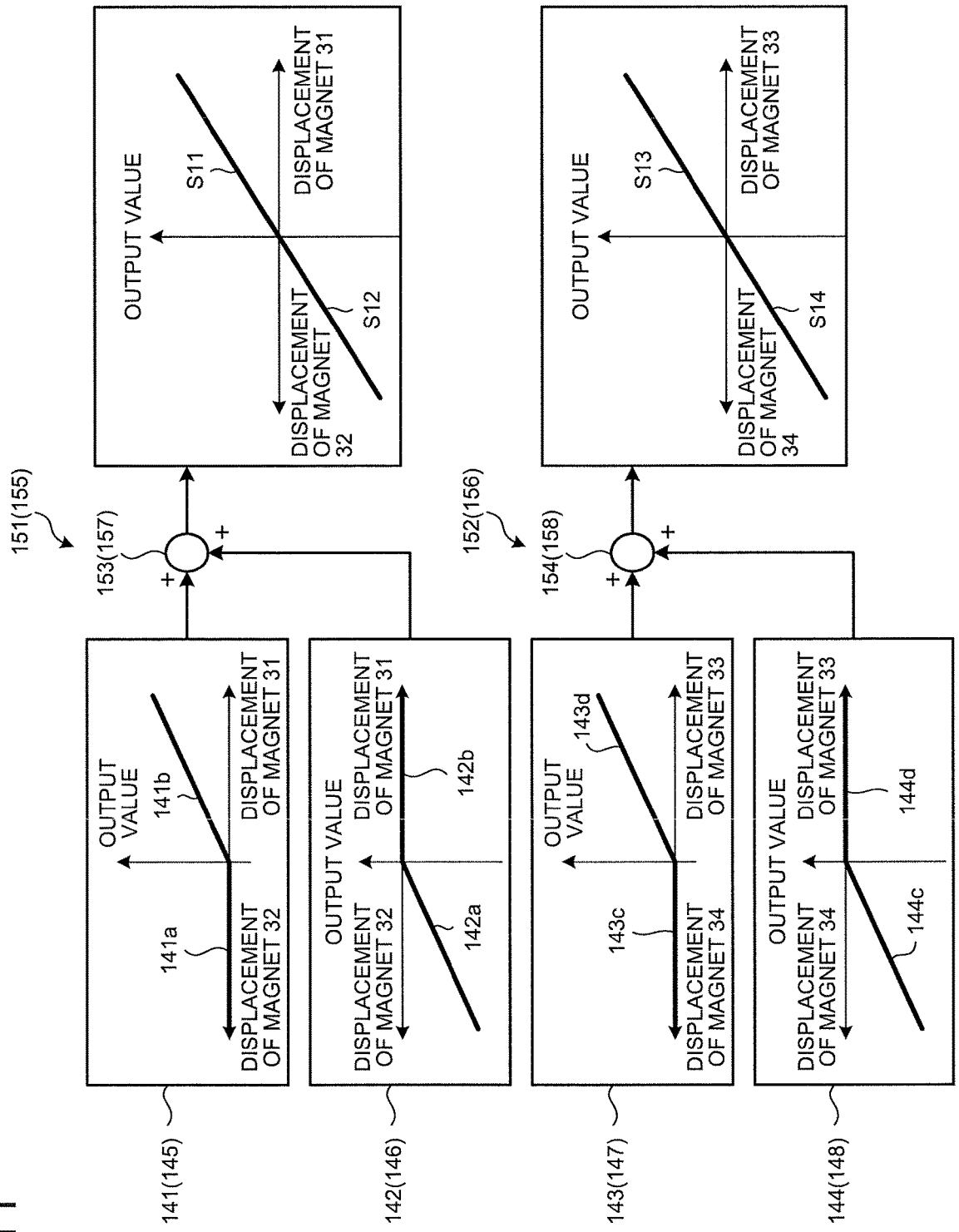
FIG. 11 is a block diagram illustrating examples of a magnetic sensor and a processing unit of a stroke detection device according to a second embodiment.

FIG. 11 is a block diagram illustrating examples of a magnetic sensor and a processing unit of an operation lever according to the second embodiment. In FIG. 11, output values of magnetic sensors 141, 142, 143, and 144 are illustrated by graphs. In the graphs for the magnetic sensors 141 and 142, the vertical axis indicates an output value, the right direction on the horizontal axis indicates the displacement of the magnet 31, and the left direction on the horizontal axis indicates the displacement of the magnet 32. In addition, in the graphs for the magnetic sensors 143 and 144, the vertical axis indicates an output value, the right direction on the horizontal axis indicates the displacement of the magnet 33, and the left direction on the horizontal axis indicates the displacement of the magnet 34. A configuration of the magnetic sensor and calculation contents in the processing unit in the second embodiment are different from those of the stroke detection device 3 according to the first embodiment. Hereinafter, the same constituent elements as those of the first embodiment will be denoted by the same reference signs, and the description thereof will be omitted or simplified.

As illustrated in FIG. 11, the magnetic sensor 141 and a magnetic sensor 145 of a stroke detection device 103 detect a magnetic field of the magnet 31. The magnetic sensor 142 and a magnetic sensor 146 detect a magnetic field of the magnet 32. The magnetic sensor 143 and a magnetic sensor 147 detect a magnetic field of the magnet 33. The magnetic sensor 144 and a magnetic sensor 148 detect a magnetic field of the magnet 34. Although the description will be given by exemplifying the magnetic sensors 141, 142, 143, and 144 hereinafter, the same description can be applied to the magnetic sensors 145, 146, 147, and 148.

As illustrated in FIG. 11, the magnetic sensor 141 and the magnetic sensor 142 are configured to output output signals whose signs are reversed from each other with respect to a reference voltage value when detecting the equal magnetic field. For example, when the magnet 31 is not displaced, that is, when the magnet 31 is held at a reference position, the magnetic sensor 141 outputs a voltage signal having a reference voltage value as an output signal 141a. Incidentally, when the magnet 31 is not displaced, the magnetic sensor 141 outputs the voltage signal having the reference voltage value as the output signal 141a regardless of the displacement of the magnet 32. When the magnet 31 is displaced with respect to the reference position, the magnetic sensor 141 outputs a voltage signal having a value corresponding to the magnitude of the displacement of the magnet 31 as an output signal 141b.

In addition, when the magnet 32 is not displaced, the magnetic sensor 142 outputs a voltage signal having a reference voltage value as an output signal 142b. In addition, when the magnet 32 is displaced with respect to a reference position, the magnetic sensor 142 outputs a voltage signal having a value corresponding to the magnitude of the displacement of the magnet 32 as an output signal 142a.

Figure 12:
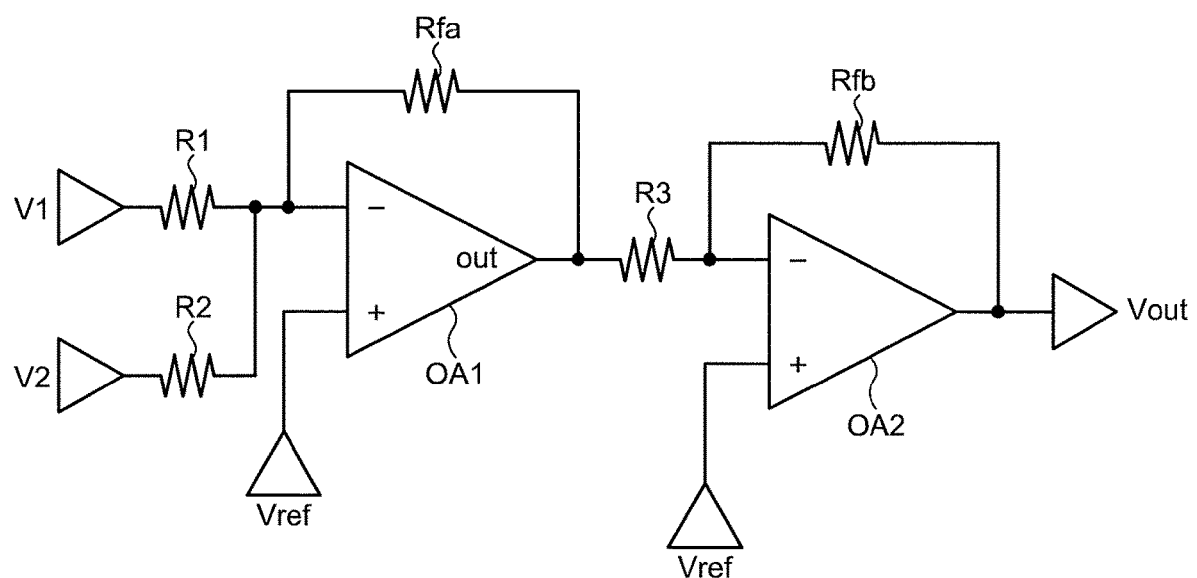
FIG. 12 is a circuit diagram illustrating an example of an arithmetic unit.

A processing unit 151 includes an arithmetic unit 153. The arithmetic unit 153 adds the output signal of the magnetic sensor 141 and the output signal of the magnetic sensor 142, amplifies the added value, and outputs the amplified value. FIG. 12 is a circuit diagram illustrating an example of the arithmetic unit 153. As illustrated in FIG. 12, for example, an adder circuit including resistors R1, R2, and Rfa and an operational amplifier OA1, and an inverter circuit including resistors R3 and Rfb and an operational amplifier OA2 can be used as the arithmetic unit 153. When an output signal V1 of the magnetic sensor 141 and an output signal V2 of the magnetic sensor 142 are input to the arithmetic unit 153, a detection signal Vout obtained by amplifying an added value of these output signals is output.

In addition, the magnetic sensor 143 and the magnetic sensor 144 are configured to output output signals whose signs are inverted from each other with respect to a reference voltage value when detecting the equal magnetic field. For example, when the magnet 33 is not displaced, the magnetic sensor 143 outputs a voltage signal having a reference voltage value as an output signal 143a. When the magnet 33 is displaced with respect to a reference position, the magnetic sensor 143 outputs a voltage signal having a value corresponding to the magnitude of the displacement of the magnet 33 as an output signal 143b.

When the magnet 34 is not displaced, the magnetic sensor 144 outputs a voltage signal having a reference voltage value as an output signal 144b. When the magnet 34 is displaced with respect to a reference position, the magnetic sensor 144 outputs a voltage signal having a value corresponding to the magnitude of the displacement of the magnet 34 as an output signal 144a.

A processing unit 152 includes an arithmetic unit 154. The arithmetic unit 154 adds the output signal of the magnetic sensor 143 and the output signal of the magnetic sensor 144, amplifies the added value, and outputs the amplified value. It is possible to use a circuit similar to the adder circuit illustrated in FIG. 12 as the arithmetic unit 154.

In the above configuration, for example, when the lever portion 1 is tilted in the first direction D1, the magnetic sensors 141 and 142 output the output signals 141b and 142b, respectively (see FIG. 11). In this case, the output signal 141b of the magnetic sensor 141 and the output signal 142b of the magnetic sensor 142 are input to the arithmetic unit 153. The arithmetic unit 153 adds the output signal 141b and the output signal 142b, amplifies the added value, and outputs the amplified value. The processing unit 151 outputs the signal output from the arithmetic unit 153 as a detection signal S11.

In addition, for example, when the lever portion 1 is tilted in the second direction D2, the magnetic sensors 141 and 142 output the output signals 141a and 142a, respectively (see FIG. 11). In this case, the output signal 141a of the magnetic sensor 141 and the output signal 142a of the magnetic sensor 142 are input to the arithmetic unit 153. The arithmetic unit 153 adds the output signal 141a and the output signal 142a, amplifies the added value, and outputs the amplified value. The processing unit 151 outputs the signal output from the arithmetic unit 153 as a detection signal S12.

When the lever portion 1 is tilted in the first direction D1 or the second direction D2, an inclination thereof does not change in the third direction D3 side and the fourth direction D4 side of the disk 7. Therefore, there is no movement of the magnets 33 and 34. Meanwhile, there is a case where the magnetic sensors 143 and 144 detect a part of the magnetic fields generated by the magnets 31 and 32.

Figure 13:
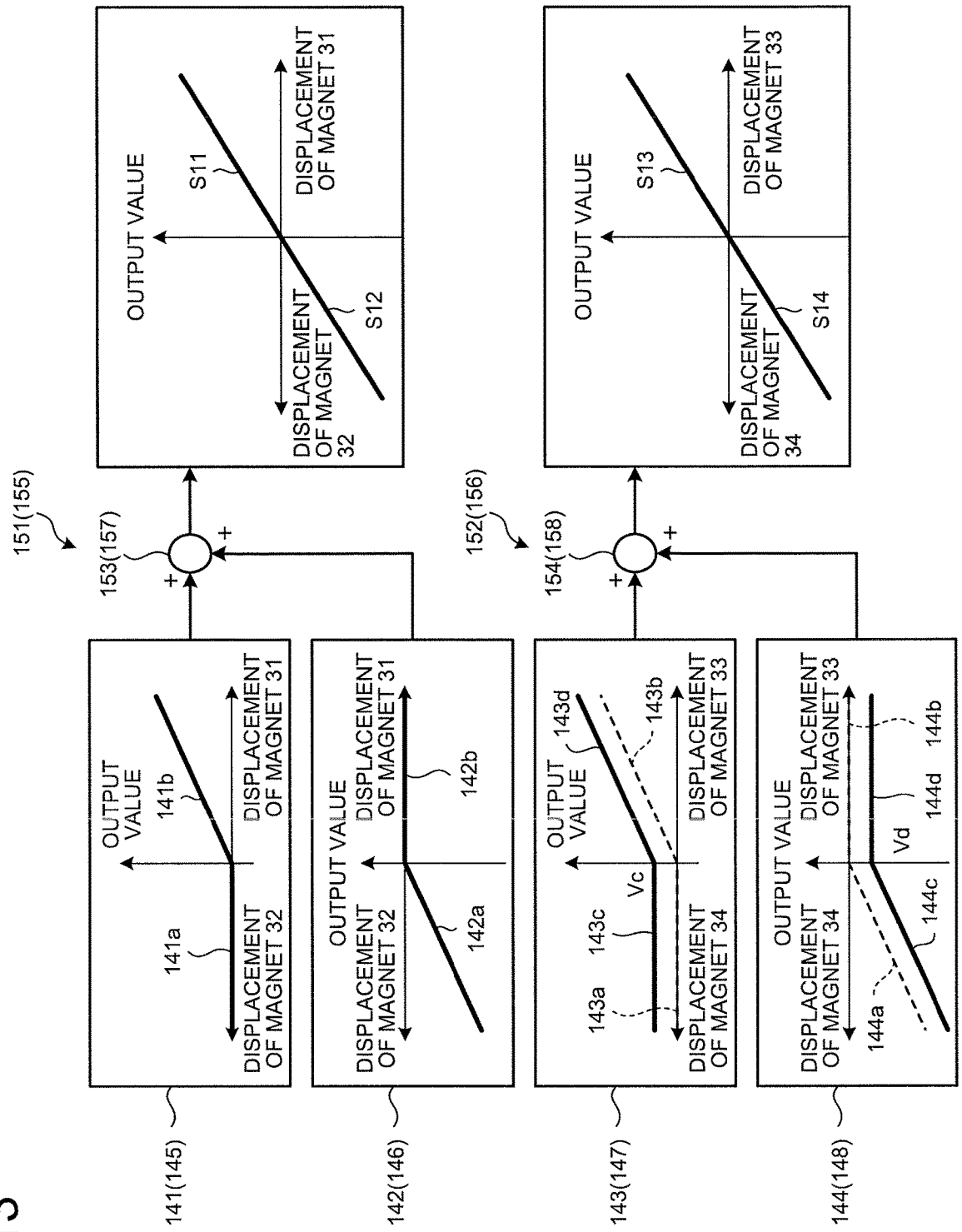
FIG. 13 is a block diagram illustrating examples of processing contents in the processing unit.

FIG. 13 is a block diagram illustrating examples of processing contents when the magnetic sensors 143 and 144 detect a part of the magnetic field generated by the magnet 31. The output values of the magnetic sensors 141, 142, 143, and 144 are illustrated by graphs in FIG. 13, which is similar to FIG. 11. In the graphs for the magnetic sensors 141 and 142, the vertical axis indicates an output value, the right direction on the horizontal axis indicates the displacement of the magnet 31, and the left direction on the horizontal axis indicates the displacement of the magnet 32. In addition, in the graphs for the magnetic sensors 143 and 144, the vertical axis indicates an output value, the right direction on the horizontal axis indicates the displacement of the magnet 33, and the left direction on the horizontal axis indicates the displacement of the magnet 34.

As illustrated in FIG. 13, the magnetic sensor 143 outputs output signals 143c and 143d obtained by adding a voltage Vc to the output signals 143a and 143b, respectively. The magnetic sensor 144 outputs output signals 144c and 144d obtained by subtracting a voltage Vd from the output signals 144a and 144b, respectively.

The magnetic sensor 143 and the magnetic sensor 144 are disposed at line-symmetrical positions with respect to the perpendicular bisector L4, and thus, have equal distance from the magnet 31. Therefore, the magnetic sensors 143 and 144 detect the equal intensity of the magnetic field generated in the magnet 31, which is similar to the first embodiment. Accordingly, since the voltage Vc and the voltage Vd are values equal to each other, the output signals 143c and 143d and the output signals 144c and 144d become voltage signals whose signs are inverted with respect to the reference voltage value when the positive direction and the negative direction are made coincident on the horizontal axis.

The output signals 143c and 143d of the magnetic sensor 143 and the output signals 144c and 144d of the magnetic sensor 144 are input to the arithmetic unit 154. The arithmetic unit 154 adds the output signals 143c and 143d and the output signals 144c and 144d, amplifies the added values, and outputs the amplified values. As described above, the output signals 143c and 143d and the output signals 144c and 144d are voltage signals whose signs are inverted with respect to the reference voltage value, the voltage Vc and the voltage Vd are canceled in the output results added by the arithmetic unit 154.

As described above, the arithmetic unit 154 cancels the voltage Vc and the voltage Vd corresponding to a part of the magnetic field generated by the magnet 31 out of the output signals 143c and 143d and the output signals 144c and 144d output from the magnetic sensors 143 and 144 by the calculation to output a detection signal S12. Thus, even when a part of the magnetic field generated by the magnet 31 is detected by the magnetic sensors 143 and 144, the processing unit 152 does not output the voltage Vc and the voltage Vd corresponding to the part of the magnetic field of the output signals of the magnetic sensors 143 and 144.

In addition, for example, when the lever portion 1 is tilted in the third direction D3, the magnetic sensors 143 and 144 output the output signals 143b and 144b, respectively (see FIG. 11). In this case, the output signal 143b of the magnetic sensor 143 and the output signal 144b of the magnetic sensor 144 are input to the arithmetic unit 153. The arithmetic unit 153 adds the output signal 143b and the output signal 144b, amplifies the added value, and outputs the amplified value.

The processing unit 151 outputs the signal output from the arithmetic unit 153 as a detection signal S11.

In addition, for example, when the lever portion 1 is tilted in the fourth direction D4, the magnetic sensors 143 and 144 output the output signals 143a and 144a, respectively (see FIG. 11). In this case, the output signal 143a of the magnetic sensor 143 and the output signal 144a of the magnetic sensor 144 are input to the arithmetic unit 153. The arithmetic unit 153 adds the output signal 143a and the output signal 144a, amplifies the added value, and outputs the amplified value. The processing unit 151 outputs the signal output from the arithmetic unit 153 as a detection signal S12.

There is a case where the magnetic sensors 141 and 142 detect a part of the magnetic fields generated by the magnets 33 and 34 when the lever portion 1 is tilted in the third direction D3 or the fourth direction D4, which is similar to the first embodiment. In the present embodiment, the magnetic sensor 141 and the magnetic sensor 142 are disposed at line-symmetrical positions with respect to the perpendicular bisector L2, and thus, have equal distance from the magnets 33 and 34. Thus, the arithmetic unit 53 cancels voltages corresponding to a part of the magnetic fields generated by the magnets 33 and 34 out of the output signals output from the magnetic sensors 141 and 142 by the calculation, which is similar to the first embodiment.

In this manner, the stroke detection device 103 according to the present embodiment is formed so as to output the output signals whose signs are inverted with respect to the reference voltage value when the magnetic sensor 141 detecting the magnet 31 and the magnetic sensor 142 detecting the magnet 32 detect the equal magnetic field. In addition, the processing unit 151 outputs the detection signal based on the calculation result obtained by adding the output signal of the magnetic sensor 141 and the output signal of the magnetic sensor 142. In addition, similarly, the magnetic sensor 143 detecting the magnet 33 and the magnetic sensor 144 detecting the magnet 34 are also formed so as to output the output signals whose signs are inverted with respect to the reference voltage value when detecting the equal magnetic field. In addition, the processing unit 152 outputs the detection signal based on the calculation result obtained by adding the output signal of the magnetic sensor 143 and the output signal of the magnetic sensor 144. As a result, it is possible to reliably reduce erroneous detection without using complicated signal processing. In addition, erroneous detection can be similarly reduced even for a uniform magnetic disturbance.

Figure 14:
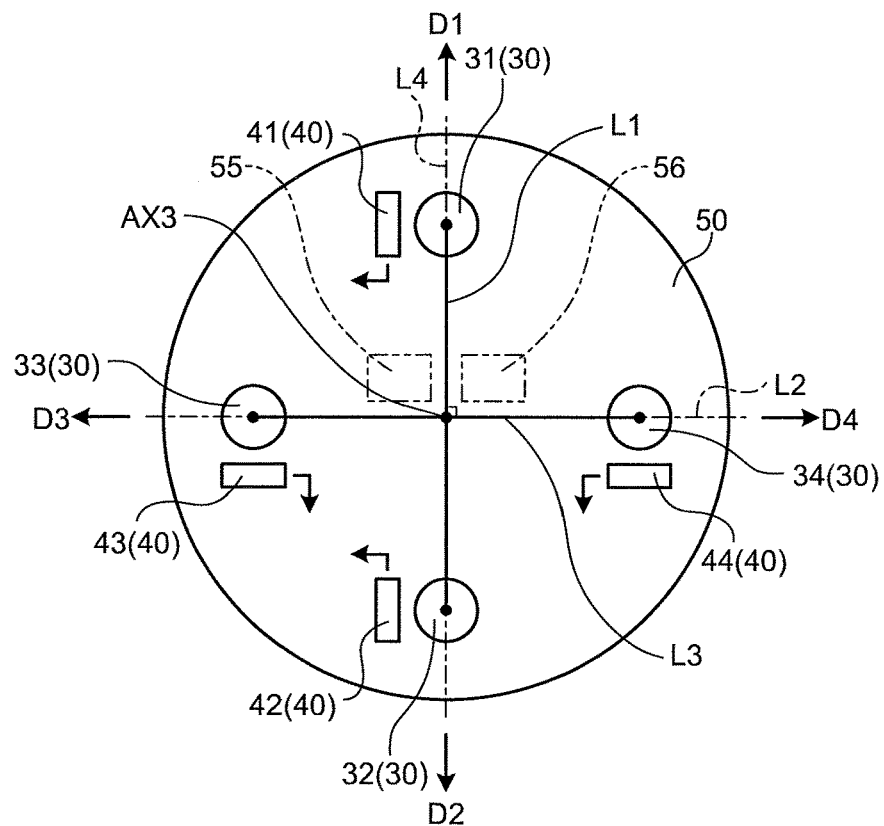
FIG. 14 is a view schematically illustrating a modified example of a positional relationship among magnets and magnetic sensors when viewed from an axial direction of a central axis.

A technical scope of the present invention is not limited to the above-described embodiments, and appropriate modifications can be made within a scope not departing from a gist of the present invention. For example, the description has been given in the above embodiments by exemplifying the configuration in which the two magnetic sensors 40 are disposed for the single magnet 30, but the invention is not limited thereto. FIG. 14 is a view schematically illustrating a modified example of the positional relationship between the magnet 30 and the magnetic sensor 40 when viewed from the axial direction of the operation axis AX3. For example, a configuration in which the single magnetic sensor 40 is disposed for the single magnet 30 may be adopted as illustrated in FIG. 14.

Figure 15:
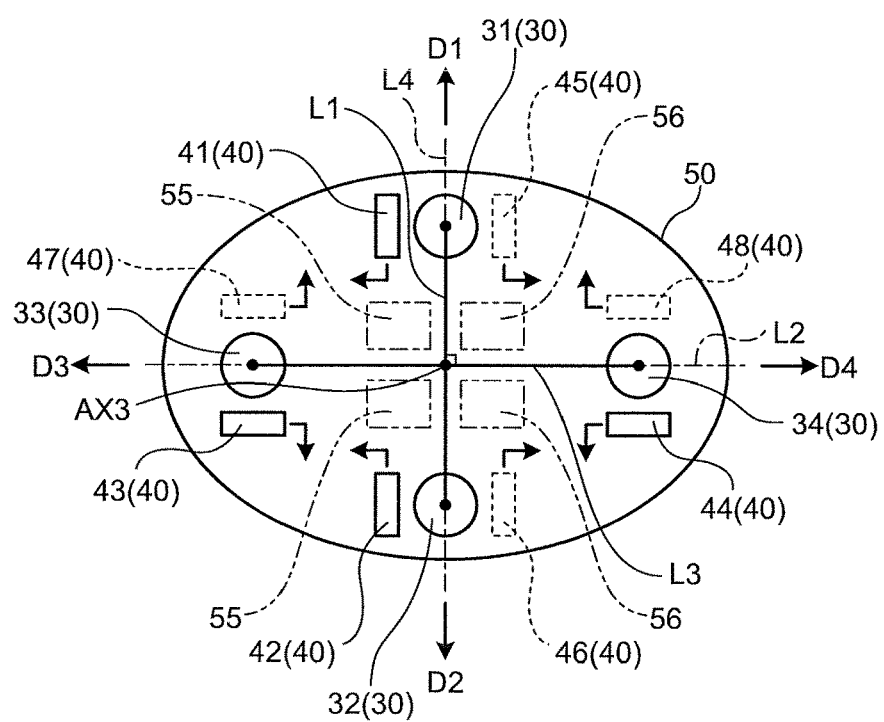
FIG. 15 is a view schematically illustrating a modified example of a positional relationship among magnets and magnetic sensors when viewed from an axial direction of a central axis.

In addition, the description has been given in the above embodiments by exemplifying the configuration in which the distances between the operation axis AX3 and each of the four magnets 30 are equal, but the invention is not limited thereto. FIG. 15 is a view schematically illustrating a modified example of the positional relationship between the magnet 30 and the magnetic sensor 40 when viewed from the axial direction of the operation axis AX3. For example, a configuration in which distances between each of the four magnets 30 and the operation axis AX3 are different may be adopted as illustrated in FIG. 15. In this case, it is possible to make the distances of the two magnets 30, which oppose each other in a direction orthogonal to the operation axis AX3, equal with respect to the operation axis AX3. Incidentally, the arithmetic unit is described as an analog circuit, but the calculation may be performed by a controller using a CPU. In addition, the output of each magnetic sensor is described as an analog voltage, but may be PWM or the like. In this case, it is sufficient to perform the calculation with a controller using a CPU.

In addition, the description has been given in the above embodiments by exemplifying the case where the lever portion 1 is tilted from the neutral position in each of the first direction D1, the second direction D2, the third direction D3, and the fourth direction D4, the invention is not limited thereto. For example, each of the detection sensors 40 can output the component corresponding to the magnetic field of the magnet 30 which is the original detection target and cancel the component corresponding to the magnetic field of the magnet 30 different from the original detection target in the same manner even when the lever portion 1 is tilted from the neutral position in each of the direction between the first direction D1 and the third direction D3, the direction between the first direction D1 and the fourth direction D4, the direction between the second direction D2 and the third direction D3, and the direction between the second direction D2 and the fourth direction D4.

REFERENCE SIGNS LIST

D1 FIRST DIRECTION
D2 SECOND DIRECTION
D3 THIRD DIRECTION
D4 FOURTH DIRECTION
L1, L3 LINE SEGMENT
L2, L4 PERPENDICULAR BISECTOR
R1, R2, R11, R3, R12, R13, Rf RESISTOR
S1, S2, S3, S4, S11, S12, Vout DETECTION SIGNAL
V1, V2, 41a, 41b, 42a, 42b, 43a, 43b, 43c, 43d, 44a, 44b, 44c, 44d, 141a, 141b, 142a, 142b, 143a, 143b, 143c, 143d, 144a, 144b, 144c, 144d OUTPUT SIGNAL
OA OPERATIONAL AMPLIFIER
AX1, AX2, AX3 CENTRAL AXIS
1 LEVER PORTION
2 TRANSMISSION DEVICE
3, 103 STROKE DETECTION DEVICE
4 COUPLING SHAFT
5 SUPPORT SHAFT
6 UNIVERSAL JOINT
6a FIRST SHAFT MEMBER
6b ROTATING MEMBER
6c SECOND SHAFT MEMBER
7 DISK
7a OPPOSING SURFACE
8 COUPLING MEMBER
9 BOOT
10 DEVICE BODY
11 HOUSING
12 PLATE
20, 21, 22, 23, 24 ROD
20a FLANGE PORTION
20b MAGNET HOLDING PORTION
25 PISTON 25*a* TUBULAR PORTION
25*b* PROTRUDING PORTION
25*c* END PORTION
25*d* CONCAVE PORTION
26 SPRING MEMBER
27 SPRING RECEIVING MEMBER
30, 31, 32, 33, 34 MAGNET
35 MAGNETIC GUIDE
40, 41, 42, 43, 44, 45, 46, 47, 48, 141, 142, 143, 144, 145, 146, 147, 148 MAGNETIC SENSOR
50 CIRCUIT BOARD
50*a*, 50*b*, 50*c*, 50*d* THROUGH-HOLE
51, 52, 55, 56, 151, 152 PROCESSING UNIT
53, 54, 57, 58, 153, 154 ARITHMETIC UNIT
100 OPERATION LEVER

The invention claimed is:

1. An operation lever comprising:
four rods including a pair of rods, disposed at point-symmetrical positions in a first direction and a second direction opposite to the first direction with respect to an operation axis, and a pair of rods disposed point-symmetrically in a third direction orthogonal to the first direction and the second direction and a fourth direction opposite to the third direction with respect to the operation axis;
magnets disposed, respectively, on the rods;
magnetic guides formed of a magnetic material and disposed, respectively, around a portion where each of the magnets moves; and
magnetic sensors disposed inside the magnetic guides and disposed at line-symmetrical positions with respect to a second straight line perpendicular to a first straight line connecting centers of one of the rods and the other rod, which oppose each other with the operation axis as a center among the four rods, on a plane perpendicular to the operation axis,
wherein each of the magnetic guides guides a magnetic field of the magnet disposed therein to suppress the magnetic field from leaking to an outside of each magnetic guide.

2. The operation lever according to claim 1, comprising a processing unit which outputs a detection signal regarding a change in a relative position of each of the magnets based on output signals of the magnetic sensors.

3. The operation lever according to claim 2, wherein the processing unit outputs the detection signal based on a calculation result obtained by subtracting, from an output signal of the magnetic sensor detecting one of the magnets, an output signal of the magnetic sensor detecting the other magnet.

4. The operation lever according to claim 2, wherein the processing unit outputs the detection signal based on a calculation result obtained by adding an output signal of the magnetic sensor detecting one of the magnets and an output signal of the magnetic sensor detecting the other magnet.

5. The operation lever according to claim 1, wherein two sets of the pair of rods are disposed on an identical circumference about the operation axis such that the rods are equidistant from each other,
each of the rods is movable along an axial direction of the operation axis, and
each of the magnets moves integrally with each of the rods.

6. The operation lever according to claim 1, wherein each of the magnetic sensors is disposed to be aligned with respect to the magnet to be detected in a direction parallel to the second straight line.

7. The operation lever according to claim 1, wherein two magnetic sensors are provided for each magnet.

8. The operation lever according to claim 7, wherein the two magnetic sensors are disposed on both sides in a direction parallel to the second straight line with respect to the one magnet to be detected.

9. The operation lever according to claim 8, wherein the two magnetic sensors are disposed equidistant from each magnet to be detected.

* * * * *